United States Patent [19]
Robinson

[11] Patent Number: 4,839,542
[45] Date of Patent: Jun. 13, 1989

[54] ACTIVE TRANSCONDUCTANCE FILTER DEVICE

[75] Inventor: Jeffrey I. Robinson, New Fairfield, Conn.

[73] Assignee: General DataComm Industries, Inc., Middlebury, Conn.

[21] Appl. No.: 642,912

[22] Filed: Aug. 21, 1984

[51] Int. Cl.$^4$ .......................... H03K 5/00; H03B 1/00
[52] U.S. Cl. ................................. 307/520; 307/497; 328/127; 328/167; 330/253
[58] Field of Search ............... 307/494, 496, 497, 520; 328/127, 151, 165, 167, 138; 330/253, 277; 333/19, 213, 214, 216, 217, 165; 364/489

[56] References Cited

U.S. PATENT DOCUMENTS

| | | | |
|---|---|---|---|
| 3,286,188 | 11/1966 | Castellano | 328/155 |
| 3,633,108 | 1/1972 | Knever | 328/155 |
| 4,168,440 | 9/1979 | Gray | 328/167 |
| 4,185,211 | 1/1980 | Kucharewski | 330/257 |
| 4,290,186 | 9/1981 | Klein et al. | 357/23 |
| 4,470,191 | 9/1984 | Cottrell et al. | 357/91 |

OTHER PUBLICATIONS

Franco, "Use Transconductance Amplifiers", Electronic Design, vol. 24, No. 19, 13 Sep. 1976, pp. 98–101.
Khorramabadi et al., "High Freq. CMOS Continuous-Time Filters", IEEE Journal of S.-S. Circuits, vol. SC-19, No. 6, Dec. 1984, pp. 939-948.
Hosticka, "Dynamic Amplifiers CMOS Tech.", Electronic Letters, vol. 15, No. 25, 06 Dec. 1979, pp. 819-820.
Malvar, "Active C Filters and Equalizers with Operational Transconductance Amplifiers", IEEE Trans. on Circuits & Systems, vol. CAS-31, No. 7, Jul. 1984, pp. 645-648.
Martin et al., "Exact Design of Switched-Capacitor Bandpass Filters Using Coupled-Biquad Structures", *IEEE Transactions on Circuits and Systems*, vol. CAS-27, No. 6, pp. 469-475 (Jun. 1980).

*Primary Examiner*—Stanley D. Miller
*Assistant Examiner*—Timothy P. Callahan
*Attorney, Agent, or Firm*—Pennie & Edmonds

[57] ABSTRACT

An integrator is described that is useful in forming low pass, band pass, high pass, and band stop filters. The integrator comprises a transconductance amplifier and a capacitor which is connected between the amplifier output terminal and the amplifier ground. When implemented as a monolithic IC, the integrator gain is fundamentally process independent. A ladder structure comprising one or more of these integrators provides high order filtering characteristics without many of the problems associated with conventional filter devices. In addition, the integrator provides stop band, zero filter characteristics at the filter output terminal when a capacitor is connected across the differential input terminals of the integrator.

12 Claims, 14 Drawing Sheets

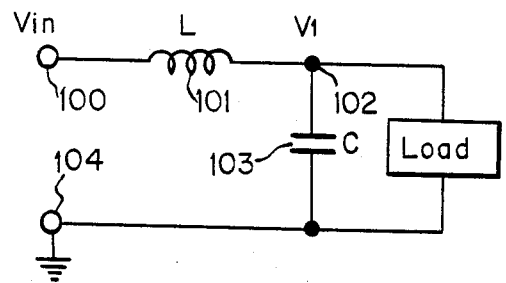
FIG. 3a(1)
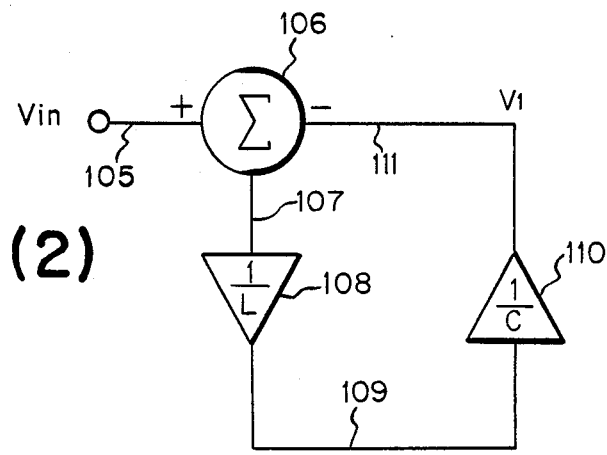
FIG. 3a(2)
FIG. 3a(3)
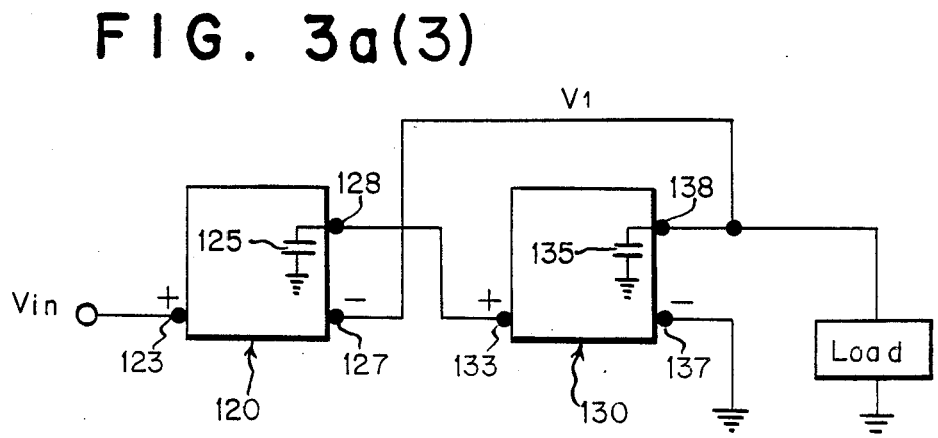

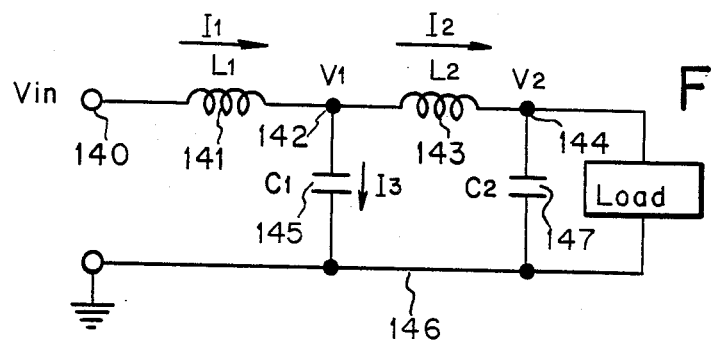
FIG. 3b(1)
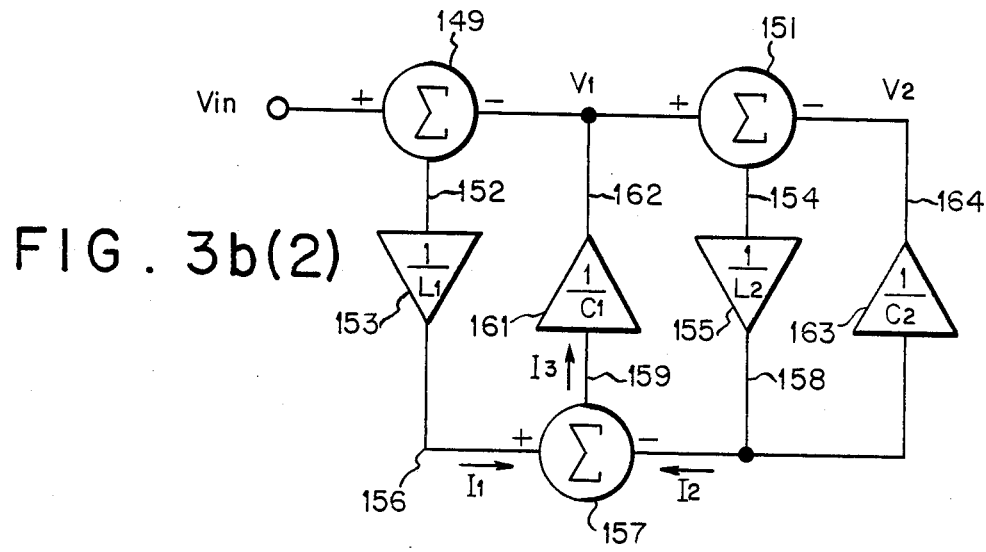
FIG. 3b(2)
FIG. 3b(3)
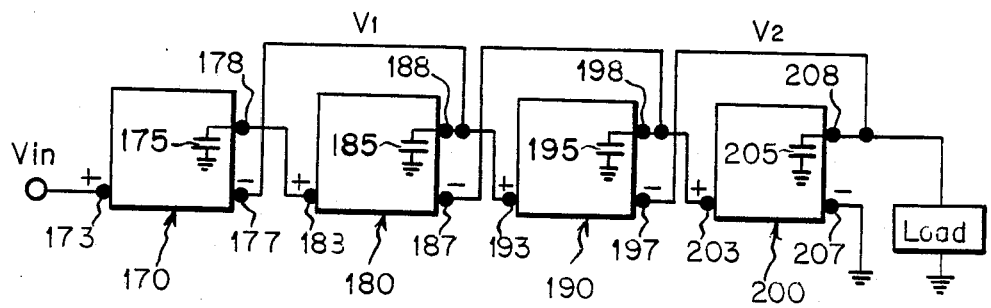

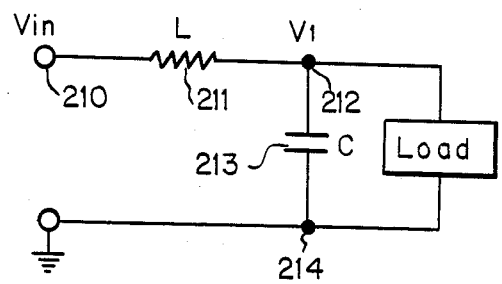
FIG. 3c(1)
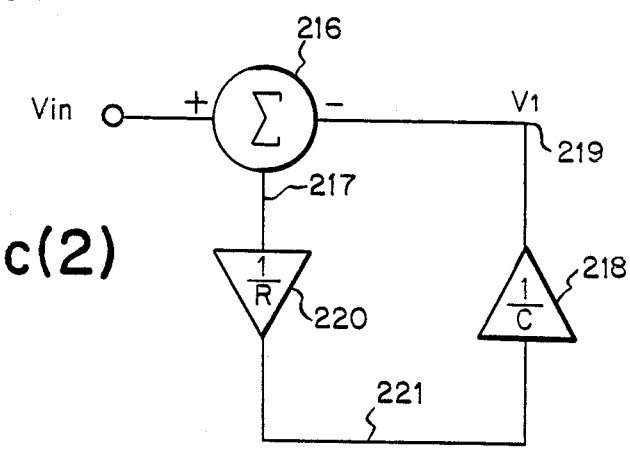
FIG. 3c(2)
FIG. 3c(3)
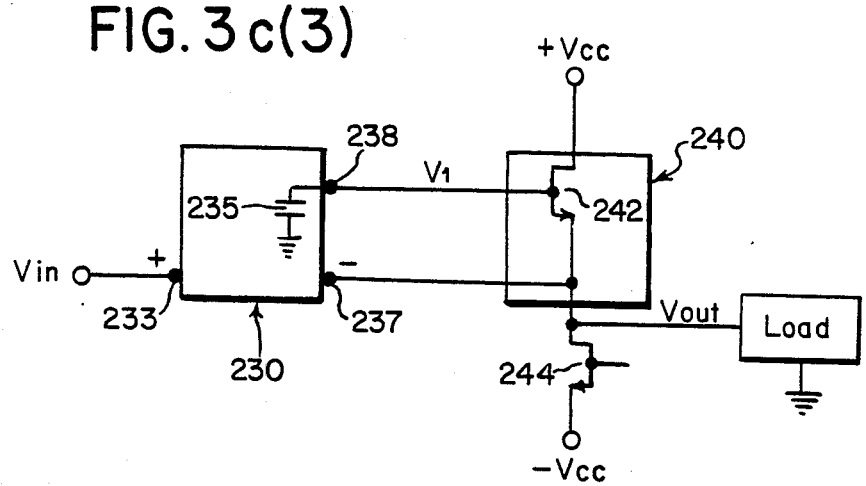

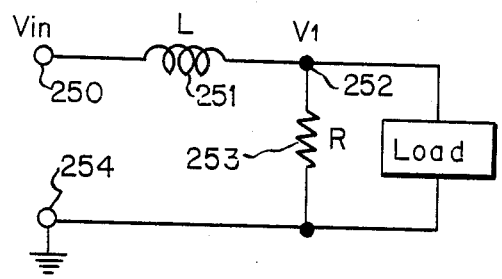
FIG. 3d(1)
FIG. 3d(2)
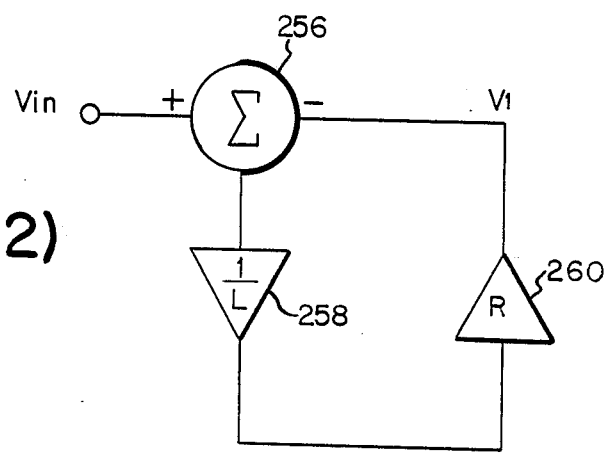
FIG. 3d(3)
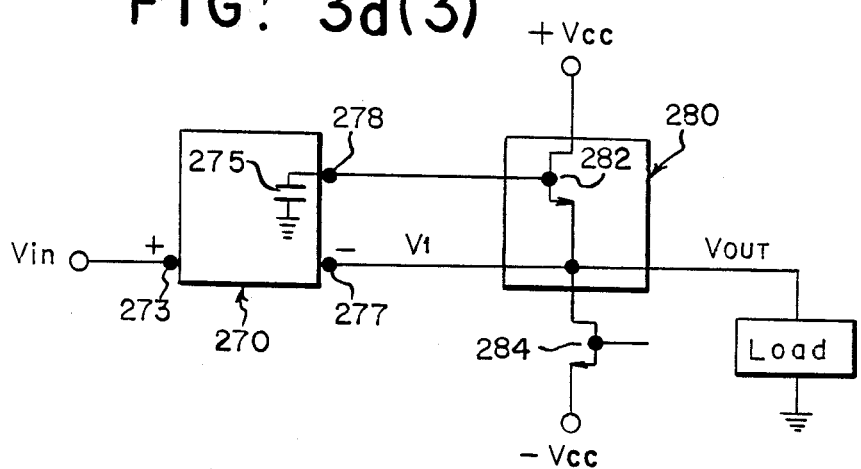

FIG. 4a(1)
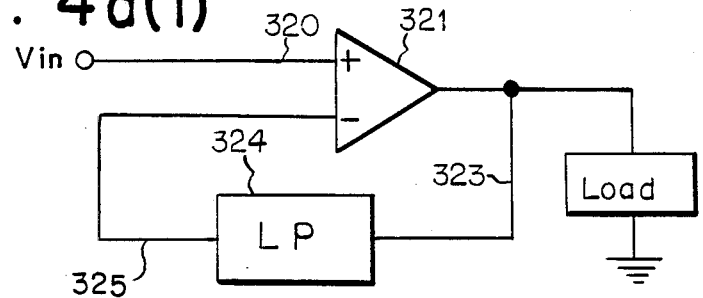
FIG. 4a(2)
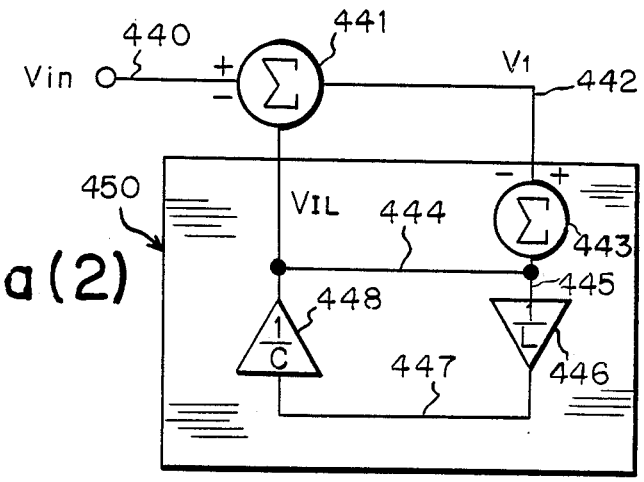
FIG. 4a(3)
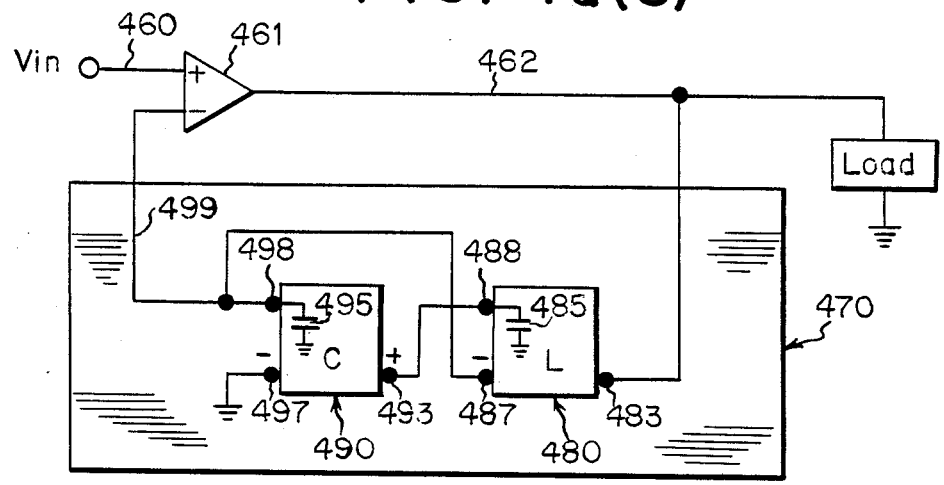

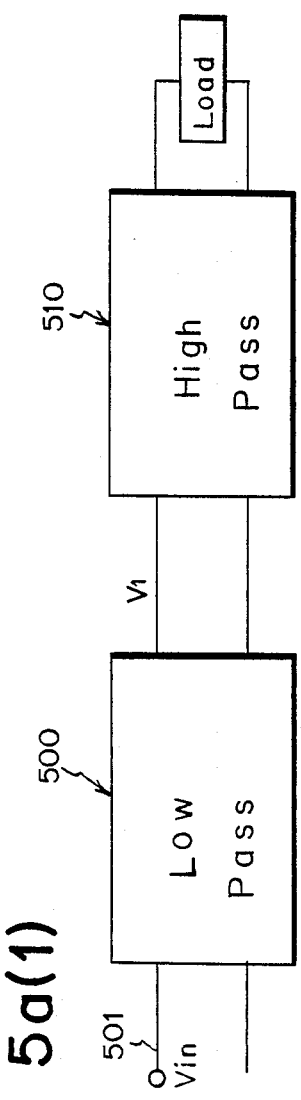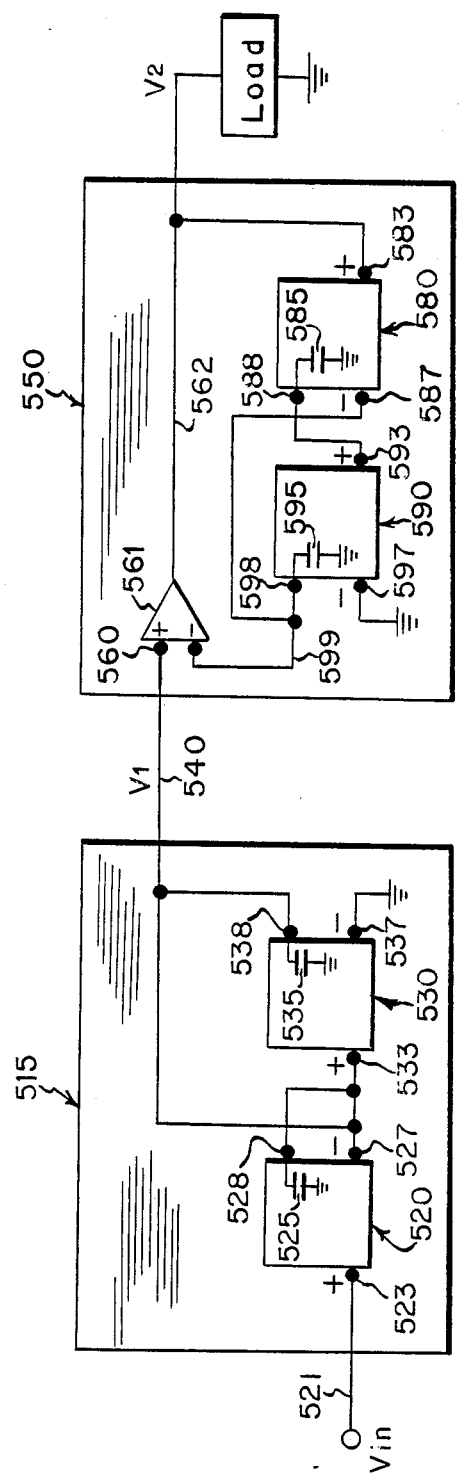
F I G. 5a(1)
F I G. 5a(2)

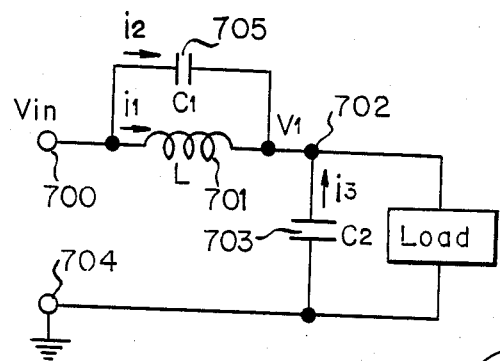
FIG. 7a(1)
FIG. 7a(2)
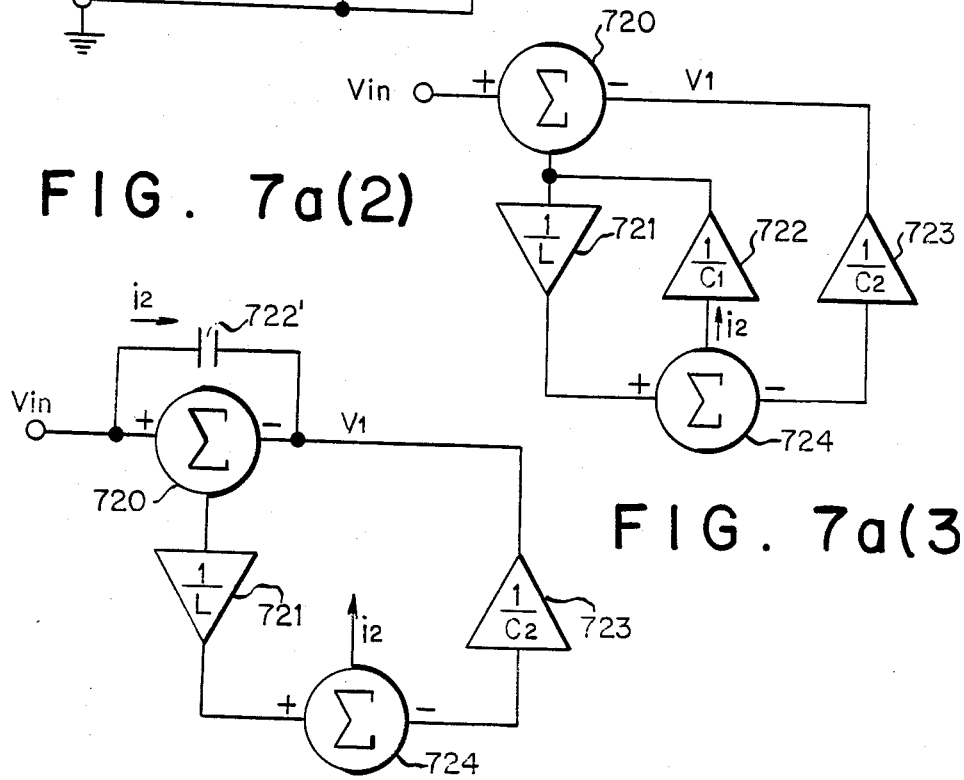
FIG. 7a(3)
FIG. 7a(4)
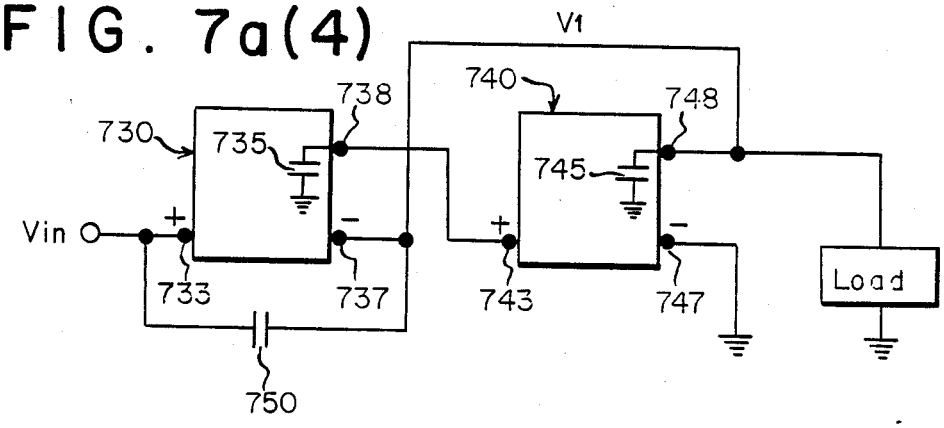

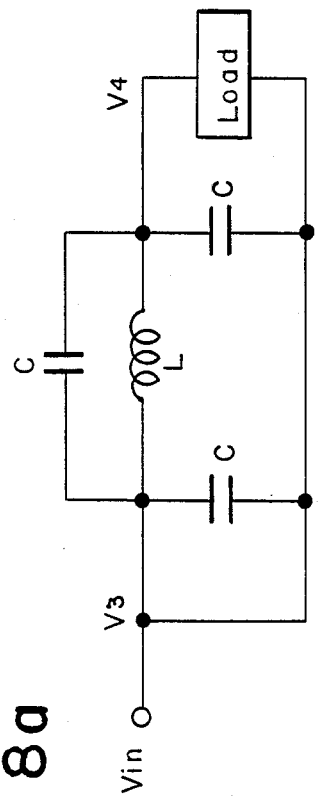
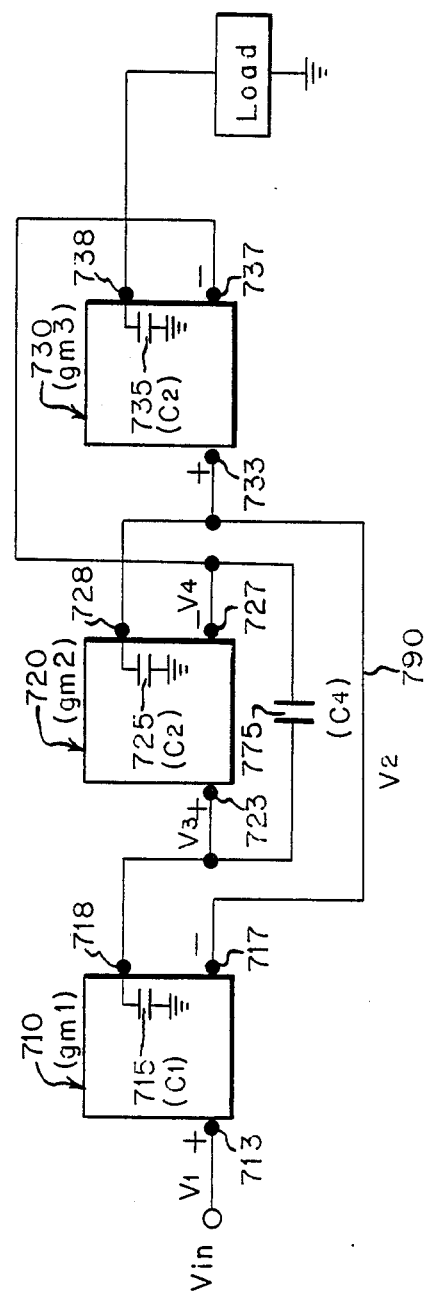
FIG. 8a
FIG. 8b

ACTIVE TRANSCONDUCTANCE FILTER DEVICE

BACKGROUND OF THE INVENTION

1. Field of the Invention

The present invention relates to a device for performing low pass, band pass, high pass as well as stop band filtering operations on electrical signals.

2. Description of the Prior Art

Filters are networks of electronic components that tailor signals to meet requirements of signal pass, phase shift, or time delay. The signal requirements imposed on filters are usually defined in terms of pass band and stop band with commonly used filters performing low pass, high pass, band pass, or stop band operations on incoming electrical signals.

An example of a second-order, low pass filter is shown in FIG. 1a and its response curve in FIG. 1e. A second-order, high pass filter and its response curve are shown in FIGS. 1b and 1f. The filter characteristics are defined by the values of C and L which are readily calculated from the following formulas:

$$C = 1/w_c R \qquad (1)$$

$$L = R/w_c \qquad (2)$$

where:
C = capacitance in farads
L = inductance in henries
R = nominal terminating resistance $[= \sqrt{L/C}]$
wc = cutoff frequency A second-order, band pass filter is shown in FIG. 1c and its response curve in FIG. 1g; and a second-order, stop band filter is shown in FIG. 1d and its response curve in FIG. 1h.

Ideal filters pass frequencies within their designated pass bands with no attenuation and stop all frequencies in their stop bands with infinite attenuation. Practical filters are not ideal but, can approach the ideal if filter stages are cascaded, with the increase in stages improving the approximation in both the pass band and the stop band.

Circuit fabrication and circuit device technologies have often been determining factors in filter design procedures. Before the advent of solid state devices, filters were constructed using passive RLC (resistor, inductor, capacitor) design procedures with concomitant bulky inductors and ferromagnetic effects. With the emergence of transistors came a drastic change in design procedures from RLC filters to active RC (resistor, capacitor) filters. The availability of operational amplifiers (op-amps) on integrated circuit chips (IC) made it possible to provide all the electrical characteristics of RLC networks using only resistors and capacitors.

The attractiveness of active filters compared to their purely passive counterparts has been known and demonstrated for many years. In addition to their practical advantages of low weight, small size, and low cost, they have the theoretical advantage of easy tunability (when high-order realizations are produced by cascading second-order stages) and the ability to provide gain at the same time that a specific set of filtering characteristics is realized. The integrator gain is controlled by the dominant pole of the op-amp and by a pair of well-matched resistors in an active resistance (active R) filter or a pair of well-matched capacitors in an active capacitance (active C) filter. Such resistor or capacitors are used as voltage dividers to reduce the voltage applied to the input of the op-amp, thereby reducing the integrator gain and producing lower frequency filters.

Integration of these resistors or capacitors into an integrated circuit on the same monolithic semiconductive chip as the op-amp, however, raises several problems. It is difficult to fabricate suitable resistors using MOS processes, because of the resistivity of the diffused layers that are available to be used as resistors and/or the variability of such resistivity with applied voltage. Moreover, because the voltage divider ratios ordinarily are large, it is often difficult to achieve good matching of the layers available to be used as resistors. In contrast, capacitors can readily be formed using MOS processes, and considerably more accurate ratios can be achieved because the capacitor is ordinarily formed at the same time as the very precisely controlled gate oxide. However, it is quite difficult to provide a DC bias to the inverting input of the op-amp. This bias must come from a source impedance of greater than 100 megohms, a problem which has not been solved to date. As a result, fully integrated active C filters are not generally available.

Additional problems exist with both the active R and active C filter devices in the realization of filter roots in the frequency domain below 30 kilohertz. Large resistors or capacitors can be used to realize these roots, but they take up too much area on the chip. A MOS device could also be used in place of a large resistor, but this device introduces considerable harmonic distortion into the filter characteristics.

Another problem with both filters is that they require additional active electrical components to provide the device with stop band, zero filter characteristics.

BRIEF SUMMARY OF THE INVENTION

In one embodiment of the present invention, I have devised a filter that comprises a transconductance amplifier and an integrating capacitor connected between an output terminal of the amplifier and the amplifier ground. The filter operation is accomplished by the coaction of the output capacitor and the transconductance amplifier having a gain of where $g_m/C$ where $g_m$ is the transconductance of the amplifier and C is the capacitance of the integrating capacitor. A combination of such integrators can be connected to provide the signal pass band and stop band characteristics of the filter.

Such transconductance filters are particularly well-suited to ladder filter design techniques. In the preferred design techniques, the transconductance filters are used as integrators in the state variable model of a passive filter. The transconductance filter design technique, therefore, comprises three steps. First, a passive circuit (i.e., a circuit comprising only resistors, capacitors, and inductors) is selected from filter design reference books or is otherwise developed to model the desired filter response. Second, the passive circuit is modelled as a state variable network where integrators emulate the current and voltage relationships of the inductors and capacitors in the passive prototype. Finally, the state variable network is implemented by replacing the state variable integrators with transconductance integrators and by interconnecting the transconductance integrators according to the signal flow paths in the state variable network.

The values of the gains, $g_m/C$, of the transconductance integrators used in the filters which model the state variable integrators are readily determined from the filter design equations for the passive filter such as equations (1) and (2) above. First, a cutoff frequency is selected for a filter design, and the value of the passive elements in the passive filter are found from these design equations. Where a capacitor is replaced, the magnitude of the integrator gain $g_m/C$ is set equal to the magnitude of the capacitance of the capacitor it replaces in the passive filter. Where an inductor is replaced, the magnitude of the integrator gain is set equal to the magnitude of the inductance (in henries) of the inductor in the passive filter.

In another embodiment of my invention, a single capacitor is placed across the differential amplifier stage of the transconductance filter so that the filter provides either stop band, zero filtering characteristics (i.e., finite transmission zero) or the emulation of magnetic coupling at the output terminal of the filter device. In comparison, conventional active R and active C filters require at least two op-amps to provide such a filtering characteristic at the filter output terminal (i.e., to add a finite transmission zero to a ladder filter).

When the filter is fabricated as a monolithic IC, the filter exhibits filter characteristics which, unlike conventional filters, are largely process independent. This characteristic results from fabricating both the gate of the transistors and the dielectric of the capacitors with the same oxide layer. Both $g_m$ and C are proportional to the composition and thickness of the oxide. As a result, any change in the electrical properties of the oxide material as a result of process variations such as the deposition of a thicker oxide layer appears in both the transconductance $g_m$ and the capacitance C so that the filter integrator gain $g_m/C$ remains constant. In this manner, the filter device provides a predictable and stable filter characteristic with respect to fabrication process variations unlike conventional filter devices.

As a result of these MOS device advantages, the use of these active filter devices permits them to be readily cascaded to form any higher order ladder filter device without the instabilitiy or offset problems that plague other monolithic high order filter devices.

A final important advantage of the transconductance ladder filter design technique is that transconductance filters can be organized into ladder filter circuits so that there is a close correspondence between the ladder filter circuits and passive LC ladder networks. By exploiting this correspondence the extensive tables available for the LC networks can be used to decrease the design effort. In addition, the transconductance filter retains the low sensitivity of its passive prototype.

BRIEF DESCRIPTION OF THE DRAWINGS

These and other objects, features, and advantages of the invention will be more readily apparent from the following description of the preferred embodiments of the invention in which:

FIGS. 3a(1), 3b(1), 3c(1), and 3d(1) are circuit diagrams of a second-order, low pass LC filter, a fourth-order, low pass LC ladder filter, a first-order, low pass RC filter, and a first-order, low pass RL filter, respectively;

FIGS. 3a(2), 3b(2), 3c(2), and 3d(2) are the state variable network models of the circuits shown in FIGS. 3a(1), 3b(1), 3c(1), and 3d(1), respectively;

FIGS. 3a(3), 3b(3), 3c(3), and 3d(3) are the transconductance filter implementations of the state variable network models shown in FIGS. 3a(2), 3b(2), 3c(2), ad 3d(2), respectively;

FIGS. 4a(1), 4a(2), and 4a(3) are the circuit diagram, the state variable network, and the transconductance filter implementation of a high pass filter utilizing the present invention;

FIGS. 5a(1) and 5a(2) are the block diagram and transconductance filter implementation of a band pass filter utilizing the present invention;

FIGS. 7a(1), 7b(1), and 7c(1) are circuit diagrams of a third-order, capacitor-terminated low pass LC filter with stop band zero, a state variable model of the circuit, a modified state variable model of the circuit, and a transconductance filter implementation of the state variable network model;

FIGS. 8a(1) and 8a(2) are the circuit diagram and the transconductance filter implementation of a low pass LC filter with stop band zero;

DESCRIPTION OF THE PREFERRED EMBODIMENTS

Transconductance Integrator

Figure 2:
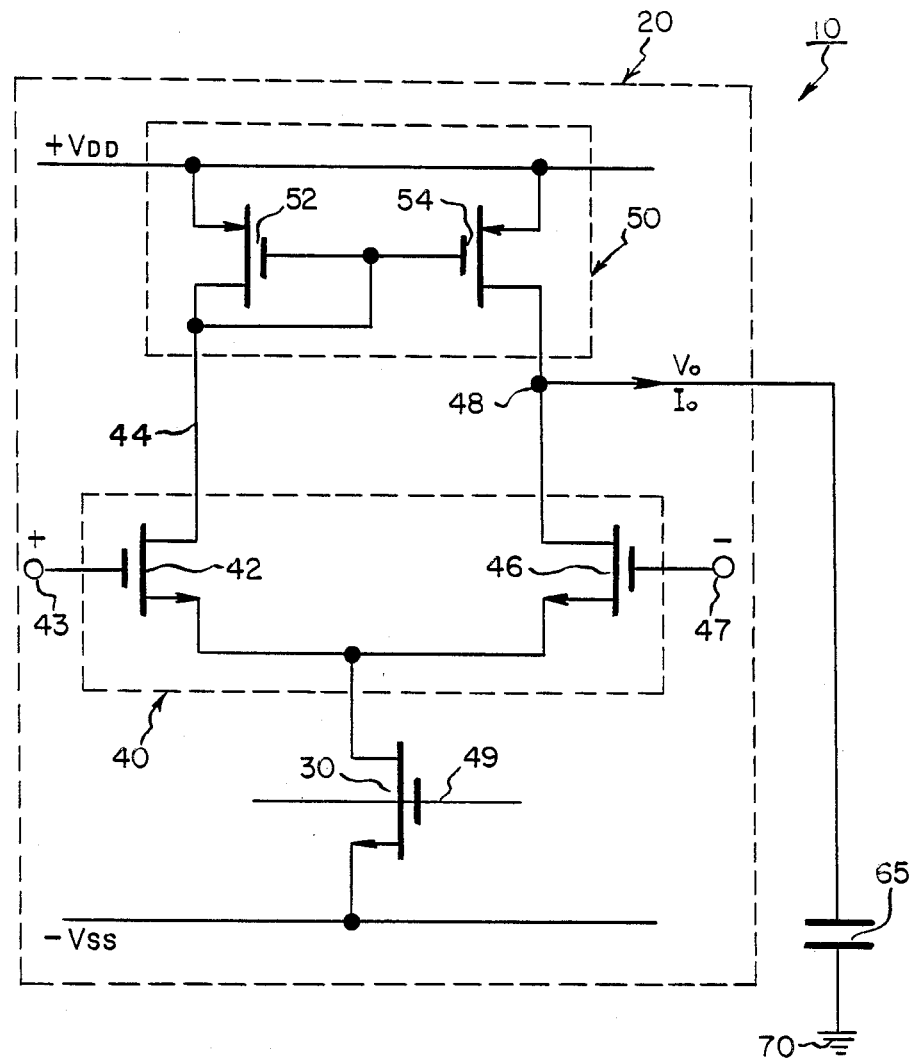
FIG. 2 is a circuit diagram of a first-order active transconductance filter circuit according to the invention.

FIG. 2 shows a two-terminal transconductance integrator 10 of the present invention comprising a transconductance amplifier 20 and a capacitor 65. The transconductance amplifier further comprises a current source circuit 30, a differential input stage 40, and a current mirror circuit 50.

Differential input stage 40 comprises N-channel transistors 42 and 46. The input signals to the amplifier are applied to terminals 43 and 47 of the transistors. The input stage generates a current out of terminals 44 and 48 which is proportional to the voltage difference between these two input signals.

Current source 30 with gate terminal 49 supplies differential amplifier 40 with constant current, i.e., the current from source 30 is fundamentally independent of the signals which are applied to the input terminals of the differential amplifier 40. In addition, the constant current source provides differential amplifier 40 with approximately zero common mode gain.

Current mirror circuit 50 comprises matched P-channel transistors 52 and 54, which provide identical current levels to N-channel transistors 42 and 46 of the differential amplifier. The current through transistor 52 produces a gate voltage for that transistor appropriate to that current at the circuit temperature for that transistor type. Because the gates of transistors 52 and 54 are connected together and the sources of these transistors are connected to the supply voltage $V_{DD}$, the gate voltage accordingly provides the same current through transistor 54. In so doing, the current mirror performs the differential input voltage to single-ended output current conversion function of the transconductance amplifier 20, where the transconductance is defined as:

$$g_m = I_o/V_{in} \quad (3)$$

where:
- $g_m$ = transconductance of amplifier 20
- $I_o$ = current at terminal 48
- $V_{in}$ = differential input voltage across terminals 43 and 47

Although in the preferred embodiment each transistor of amplifier 20 is identified as either a P-channel or an N-channel transistor, it will be obvious to those skilled in the art that each transistor could be of the opposite type. Thus, amplifier 20 can comprise N-channel transistors for current mirror 50 and P-channel transistors for differential amplifier 40 and current source 30.

Capacitor 65 integrates the output current from the transconductance amplifier as defined by the following equation $$V_o = \frac{1}{C_{65}} \int I_o dt \quad (4)$$

where:
- $V_o$ = voltage at terminal 48
- $I_o$ = current at terminal 48
- $C_{65}$ = capacitance of capacitor 65

By substituting into equation (4) the value of $I_o$ from equation (3), $V_o$ becomes $$V_o = \frac{g_m}{C_{65}} \int V_{in} dt \quad (5)$$

Thus, filter 10 provides a voltage at terminal 48 (i.e., $V_o$) which is proportional to the integrated input voltage (i.e., Vin), and with the gain of the integrator being given by $g_m/C_{65}$.

Transconductor Ladder Filter Design Technique

Transconductance integrator 10 is particularly well-suited to a three-step, ladder filter design technique. First, a passive circuit (i.e., a circuit comprising only resistors, capacitors, and inductors) is selected from filter design reference books or is otherwise developed to model the desired filter response. Second, the passive circuit is modelled as a state variable network where integrators emulate the current and voltage relationships of the inductors and capacitors in the passive prototype. Finally, the state variable network is implemented using transconductance integrators for the state variable integrators and interconnecting the transconductance integrators according to the signal flow paths in the state variable network. Where a capacitor is replaced, the gain $g_m/C$ of the transconductance integrator is set equal to the magnitude of the capacitance of that capacitor; and where an inductor is replaced, the gain of the integrator is set equal to the magnitude of the inductance of that inductor.

Second-Order, Low Pass Filter

Figure 1E:
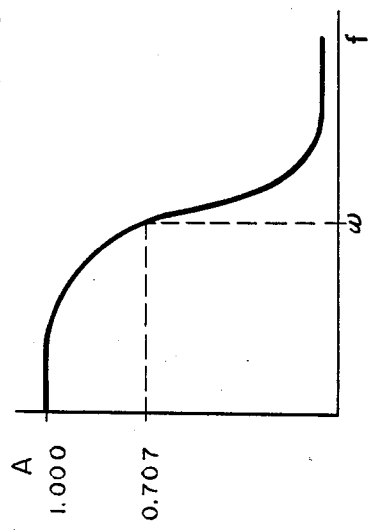
FIGS. 1e, 1f, 1g, and 1h are response curves for the filter diagrams shown in FIGS. 1a, 1b, 1c, and 1d, respectively.
Figure 1F:
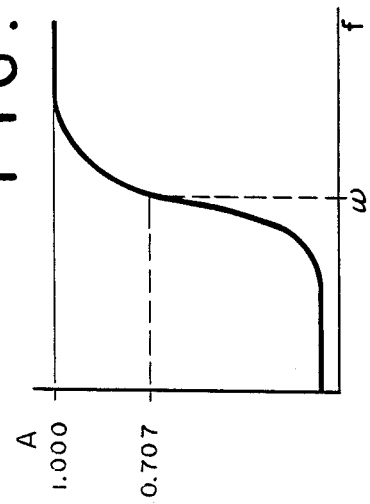
Figure 1A:
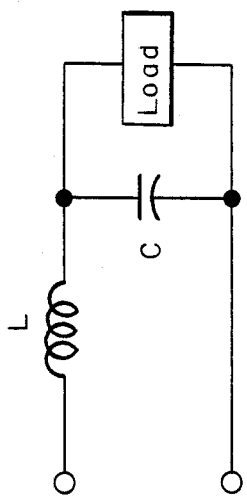
FIGS. 1a, 1b, 1c and 1d are circuit diagrams of a second-order, low pass filter, a second-order, high pass filter, a second-order, band pass filter, and, a second-order, band stop filter, respectively.
Figure 1B:
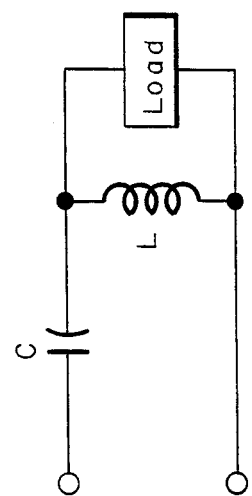
Figure 1G:
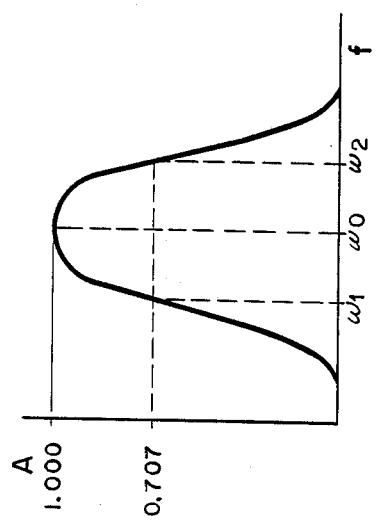
Figure 1H:
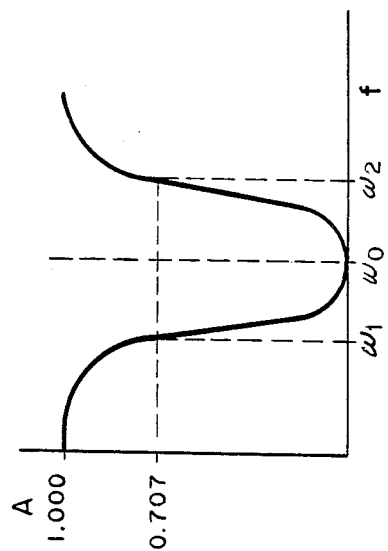
Figure 1C:
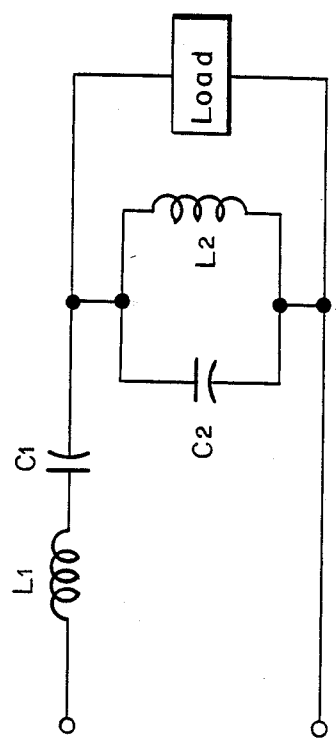
Figure 1D:
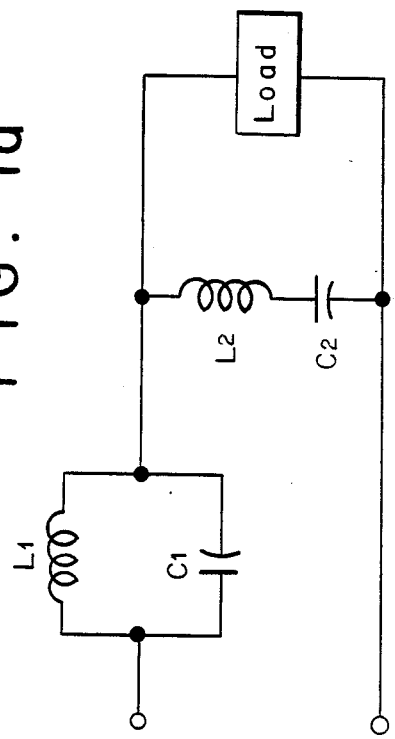

As a first example of the transconductance filter design technique, I will derive a transconductance filter implementation of the two-pole, singly terminated LC ladder filter shown in FIG. 3a(1) (also FIG. 1a). The filter of FIG. 3a(1) is a second-order, low pass filter comprising inductor 101 and capacitor 103 and having the response curve shown in FIG. 1e. The input signal $V_{in}$ to the filter is applied at terminal 100 and the desired filtered signal $V_1$ is taken at terminal 102. Terminal 104 is the filter ground potential and the reference voltage against which the input signal is measured. As described above in the "Background of the Invention," equations (1) and (2) are the design equations for calculating the values of inductor 101 and capacitor 103 to realize a particular low pass frequency characteristic.

FIG. 3a(2) is a schematic representation of a second-order, low pass filter using what is commonly known as a state variable network. In the structure, the voltage signals used in the upper part of the signal path loop are analogous to voltage signals in the passive prototype, and the signals used in the lower part of the signal path loop are analogous to current signals. The second-order structure shown in FIG. 3a(2) comprises a summer 106, inductor integrator 108, and capacitor integrator 110 with integrators 108 and 110 dividing the upper and lower parts of the signal path loop.

To obtain the state variable network shown in FIG. 3a(2) from the passive filter shown in FIG. 3a(1), the electrical operation of each passive element in FIG. 3a(1) must first be defined in terms of its current-voltage relationship. For example, all inductors perform the integrating operation:

$$i = \frac{1}{L} \int v dt \quad (6)$$

where:
- i = current through the inductor
- v = voltage across the inductor
- L = inductance of the inductor Accordingly, the state variable representation of an inductor L is an integrator which has a voltage input, a current output, and a proportionality constant (gain) equal to the reciprocal of the value of the inductor (i.e., 1/L). Thus, as shown in FIG. 3a(2), the state variable representation of the inductor 101 of FIG. 3a(1) is the inductor integrator 108, which transforms an input voltage signal from signal path 107 to an output signal on signal path 109, which is analogous to the current through this inductor The gain of integrator 108 is equal to the reciprocal of the inductance of inductor 101.

Similarly, the voltage-current relationship for a capacitor is given by:

$$v = \frac{1}{c} \int i dt \quad (7)$$

where:
- v = voltage across the capacitor
- i = current through the capacitor
- C = capacitance of the capacitor The state variable representation of a capacitor C is an integrator which has a current input, a voltage output, and an integrator gain equal to the reciprocal of the value of the capacitor (i.e., 1/C). Thus, as shown in FIG. 3a(2), the state variable representation of the capacitor 103 of FIG. 3a(1) is the capacitor integrator 110, which transforms an input signal from signal path 109 to an output voltage signal on signal path 111, which is analogous to the voltage across the capacitor. The gain of integrator 110 is equal to the reciprocal of the capacitance of capacitor 103.

Summer 106 takes the voltage difference between input signal $V_{in}$ along signal path 105 and the signal $V_1$ along signal path 111 and outputs this difference onto signal path 107, which is the input signal path to inductor integrator 108.

As shown in FIG. 3a(1), the filtered output signal of the passive filter is the voltage across capacitor 103, which is the voltage at terminal 102 taken with respect to ground reference 104. In the state variable network, the output signal from capacitor integrator 110, which models capacitor 103, travels along signal path 111. Thus, the output signal of the state variable network is taken from signal path 111.

FIG. 3a(3) shows the transconductance ladder filter implementation of the second-order, low pass filter of FIG. 3a(1). The filter comprises transconductance integrators 120 and 130. The filter is realized by first replacing each of the integrators 108 and 110 in the state variable network of FIG. 3a(2) with one of the transconductance integrators shown in FIG. 2 and then interconnecting the input terminals (shown as 43 and 47 in FIG. 2) and the output terminal (shown as 48 in FIG. 2) of the two integrators according to the signal flow paths shown in FIG. 3a(2). In particular, the inductor integrator 108 of FIG. 3a(2) is replaced as shown with the transconductance integrator 120 and capacitor integrator 110 is replaced with transconductance integrator 130. Integrator 120 has positive and negative differential input terminals 123 and 127, respectively, output terminal 128, and integrating capacitor 125. Similarly, integrator 130 has positive and negative differential inputs 133 and 137, respectively, output terminal 138, and integrating capacitor 135.

The external signal path interconnections between integrators 120 and 130 in FIG. 3a(3) are defined by the signal flows in the state variable network. In integrator 20, the input signal $V_{in}$ is applied to positive input terminal 123 and the signal $V_1$ from the output terminal of integrator 130 (which models the capacitor integrator 108) is applied to the negative input terminal 127. Thus, the input to integrator 120 is the voltage difference $V_{in} - V_1$. The output signal from terminal 128 is electrically coupled to the positive input terminal 133 of integrator 130. Since the state variable representation of integrator 130 specifies a signal input to only one input terminal of the integrator, negative input terminal 137 of integrator 130 is set at ground potential. By providing this terminal with a reference voltage, this terminal is prevented from floating to other voltage levels and deleteriously altering the filtering characteristics. As indicated above, the output signal from terminal 138 is electrically coupled to the negative input terminal 127 of integrator 120. The signal at terminal 138 is also the filter output signal corresponding to the low pass filter output signal $V_1$ in the state variable network at the output from capacitor integrator 110 and the signal $V_1$ at terminal 102 in the passive filter.

The values of the integrating capacitors 125 and 135 in the inductor integrator 120 and capacitor integrator 130 are determined from the values of inductor 101 and capacitor 103. First, a cutoff frequency is selected for a filter design and the values of the passive elements in the passive filter are found from the design equations such as those given by equations (1) and (2). The magnitude of the integrator gain constant $g_m/C$ of inductor integrator 120 is then set equal to the magnitude of the inductance (in henries) of the inductor. Similarly, the magnitude of the integrator gain constant $g_m/C$ of capacitor integrator 130 is set equal to the magnitude of the capacitance of the capacitor.

From the previous low pass filter design example, it will be appreciated by those skilled in the art that the transconductance ladder filter of the present invention provides an extremely effective technical tool for designing ladder filters. First, any passive filter is modeled as a state variable network comprising integrators. This network is then readily converted to a transconductance filter circuit by using the transconductance filters to model the state variable integrators.

Other Low Pass Filter Configurations

The simplicity of this technique makes it invaluable in implementing high order filters. For example, the passive, fourth-order, low pass filter shown in FIG. 3b(1) is easily implemented with transconductance filters using this technique. As shown in FIG. 3b(1), the filter comprises inductors 141 and 143 and capacitors 145 and 147. The input signal $V_{in}$ to the filter is applied at terminal 140, a signal $V_1$ appears at terminal 142, and the filtered signal $V_2$ is taken at terminal 144. Signals $V_{in}$, $V_1$, and $V_2$ are each taken with respect to ground terminal 146.

The first step in the design of this filter is to model the passive filter as a state variable network. The state variable network model is shown in FIG. 3b(2). The network comprises voltage summers 149, 151, and 157, inductor integrators 153 and 155, current summer 157, and capacitor integrators 161 and 163.

In the state variable model, summers 149 and 151 provide the voltage differences (i.e., differential voltages) to the inductor integrators 153 and 155 required to model the voltage differences across inductors 141 and 143 shown in FIG. 3b(1). Thus, for example, the summer 149 in FIG. 3b(2) provides to signal path 152 and hence to inductor integrator 153 the voltage difference $V_{in} - V_1$ in order to model the same voltage difference which appears across inductor 141 shown in FIG. 3b(1). In similar fashion the voltage difference $V_1 - V_2$ is provided on signal path 154 to inductor integrator 155. The voltages $V_1$ and $V_2$ are supplied on the output signal paths 162 and 164 from capacitor integrators 161 and 163, respectively.

Summer 157 models the two paths that can be taken by the input current $I_1$ that passes through inductor 141 to terminal 142. These two paths are shown in FIG. 3b(1) as the path containing inductor 143 and capacitor 147 through which flows current $I_2$ and the path containing the capacitor 145 through which flows current $I_3 = I_1 - I_2$. The flow of current $I_1$ through inductor 141 to terminal 142 of the passive filter is modeled in the state variable network as signal $I_1$ through inductor integrator 153. From the differential voltage signal on signal path 152, inductor integrator 153 generates signal $I_1$ on signal path 156 to summer 157. Because current $I_1$ flows into the transfer node in the passive filter, the corresponding signal $I_1$ in the state variable model enters the positive input terminal of summer 157. Similarly, current $I_2$ which flows through inductor 143 in the passive filter is modeled in the state variable network as signal $I_2$ through inductor integrator 155. Inductor integrator 155 generates signal $I_2$ on signal path 158 to summer 157 and capacitor integrator 163. The flow of current signal $I_2$ in the passive filter away from transfer node 142 is shown in the state variable network by the connection of signal path 157 to the negative input terminal of the summer. Current $I_3$, which flows through capacitor 145 in the passive filter, is the difference between $I_1$ and $I_2$. This current is modeled in the state variable network as the differential signal, $I_3=I_1-I_2$, on signal path 159 from summer 157 to capacitor integrator 161. From this signal, capacitor integrator 161 generates the voltage $V_1$ on signal path 162.

Once the state variable network of FIG. 3b(1) is obtained, this network is easily implemented as a transconductance ladder filter using transconductance integrators to model the state variable integrators. As shown in FIG. 3b(3), this filter comprises four transconductance integrators, 170, 180, 190, and 200 which model the four state variable integrators 153, 161, 155, and 163, respectively. In order that these integrators coact to produce the filtering characteristics of the passive filter, signal paths interconnect the integrators according to the signal flow paths in the state variable network. As in the case of the second-order filter of FIG. 3a, the values of the integrating capacitors 175, 185, 195, and 205 of the transconductance integrators 170, 180, 190, and 200 are determined by first finding the values of the passive elements 141, 145, 143, and 147 in the passive filter from design equations (1) and (2). The magnitudes of the integrator gain constants, $g_m/C$, of integrators 170, 180, 190, and 200 are then set equal to the magnitudes of the capacitance or inductance (in henries) of the passive elements 141, 145, 143, and 147, respectively.

Connections between the integrators are defined by the signal flows in the state variable network of FIG. 3b(3). The input signal $V_{in}$ to the transconductance ladder filter is applied to positive input terminal 173 of integrator 170, and the signal $V_1$ from the output terminal 188 of integrator 180 is applied to negative input terminal 177 of integrator 170. The signal $V_1$ is also applied to positive input terminal 193 of integrator 190. Output terminal 178 of integrator 170 is connected to positive input terminal 183 of integrator 180, and output terminal 198 of integrator 190 is connected to negative input terminal 187 of integrator 180. Output terminal 198 is also connected to positive input terminal 203 of integrator 200, while negative input terminal 207 is grounded. Output terminal 208 is connected to negative input terminal 197 to supply the signal $V_2$ to that terminal. Output terminal 208 also provides the output of the transconductance ladder filter. From the foregoing description and FIG. 3b(3), it will be apparent that the differential inputs of integrators 170, 180, and 190 provide the function of summers 149, 157, and 151, respectively, of FIG. 3b(2) and that the interconnection of the four integrators corresponds to the signal paths of the state variable network.

The technique of using transconductance integrators to model state variable integrators also finds application in the design of filters containing resistive elements such as the resistor-capacitor (RC), first-order, low pass filter shown in FIG. 3c(1). The filter comprises resistor 211 and capacitor 213. The input signal $V_{in}$ is applied at terminal 210 and the output signal is taken at terminal 212. Both signals are taken with reference to ground terminal 214.

FIG. 3c(2) shows the state variable network model of this passive filter. The network comprises voltage summer 216, capacitor integrator 218, and a frequency-independent amplifier 220.

In the state variable network a resistor is modeled either as a frequency-independent voltage to current transfer function or as a frequency-independent current to voltage transfer function:

$$i = \frac{1}{R} \times v \tag{8}$$

or:

$$v = R \times i \tag{9}$$

where:
 $i$=current through the resistor
 $v$=voltage across the resistor
 $R$=resistance of the resistor Amplifier 220 In FIG. 3c(2) models resistor 211 in the passive filter. Summer 216 models the voltage differential $V_{in}-V_1$ across resistor 211 in the passive filter. This difference signal is applied on input signal path 217 to amplifier 220, which generates an output signal in accordance with equation (8) on signal path 221. Signal path 221 provides a signal to capacitor integrator 218, which operates in the manner previously described with reference to capacitor integrator 110 of FIG. 3a(2) to produce voltage signal $V_1$, the output signal, which is also applied on path 219 to summer 216.

FIG. 3c(3) shows the transconductance filter implementation of the state variable network. This filter comprises a transconductance integrator 230 and a source follower 240. Source follower 240 comprises matched MOS transistors 242 and 244. For such a circuit, $V_{out}=V_1$. Transconductance integrator 230 models the capacitor integrator 218 of the state variable network. The input signal $V_{in}$ is applied to positive input terminal 233 of integrator 230 and the output signal $V_1$ (i.e., the output signal of the filter) from terminal 238 is applied to negative input terminal 237 of capacitor filter 230. Since the gain of integrator 230 is proportional to the differential input voltage and since the differential input voltage is proportional to the gain of amplifier 220, amplifier 220 can be modeled in the transconductance filter simply by adjusting the gain of integrator 230.

A first-order, low pass resistor inductor (RL) filter is shown in FIG. 3d(1). This filter comprises inductor 251 and resistor 253. The input signal $V_{in}$ is applied at terminal 250 and voltage $V_1$ is taken at terminal 252. Both signals are taken with reference to ground potential 254.

FIG. 3d(2) shows the state variable network of the possible filter. The network comprises voltage summer 256, inductor integrator 258, and amplifier 260.

From the state variable network, the transconductance filter is readily implemented as shown in FIG. 3d(3). The filter comprises a transconductance integrator 270 and a source follower 280 similar to source follower 240. Transconductance integrator 270 models inductor integrator 260 of the state variable network. Illustratively, the amplifier is implemented in the same fashion as in FIG. 3c(3). The input signal $V_{in}$ is applied to positive input 273 of integrator 270, the signal $V_1$ from terminal 278 is applied to negative input terminal 277, and the gain of integrator 270 is adjusted so as to model the gain of amplifier 260 as well.

As will be appreciated by those skilled in the art, the passive filter shown in FIG. 3d(1) produces filtering characteristics which are identical to the first-order, low pass RC filter shown in FIG. 3c(1). This similarity is a result of the identical electrical effect on the filtered output signal of an inductor in the arm of a passive filter and a capacitor in the leg of a passive filter. As a result, the transconductance filter implementation of both passive filters is similar.

High Pass Ladder Filters

Transconductance filter devices are also effective tools for high pass filter design. As an example, I will derive a transconductance filter implementation of the high pass filter of FIG. 4a(1) comprising a frequency-independent amplifier 321 and a low pass filter network 324. As shown in FIG. 4a(1), an input voltage signal $V_{in}$ on signal path 320 is applied to the positive terminal of the differential input stage of amplifier 321. A feedback signal on signal path 325 is applied to the negative terminal of the differential input stage. The desired output signal of the filter is taken from the output stage of the amplifier, which is connected to signal path 323. This signal is fed back to the negative terminal of the differential input stage of the amplifier by way of the low pass filter 324 in the feedback loop, which comprises the passive, low pass filter network shown in FIG. 3a(1).

FIG. 4a(2) shows the state variable network model of the filter of FIG. 4a(1) comprising summer 441 and the low pass state variable network model 450 shown in FIG. 3a(2). Summer 441 models the voltage difference $V_{in} - V_-$ across the differential input terminals of amplifier 321 in the modified filter (FIG. 4a(3)). This difference is applied on signal path 442 to summer 443 of the state variable network model 450 of the low pass filter of FIG. 3a(1). The state variable network model 450 comprises summer 443, inductor integrator 446, and capacitor integrator 448, which operate in a manner previously described in connection with the state variable network model shown in FIG. 3a(2). As shown in FIG. 4a(2), the signal on signal path 444 is the output signal from the low pass filter state variable model 450 and is the input signal to the negative terminal of summer 441.

From the state variable network, the transconductance filter is readily implemented as shown in FIG. 4a(3). The filter comprises an amplifier 461 and a low pass transconductance filter 470. Amplifier 461 models summer 441 of the state variable network. Low pass transconductance filter 470 models the low pass state variable model 450 of the state variable network. Illustratively, the low pass transconductance filter 470 is implemented in the same fashion as in FIG. 3a(3). In order that amplifier 461 and low pass transconductance filter 470 coact to produce the high pass filtering characteristics of the modified passive filter, signal paths interconnect the integrators according to the signal flow paths in the state variable network. The input signal $V_{in}$ to the transconductance high pass filter is applied to the positive input terminal 460 of amplifier 461, and the signal $V_1$ from the output terminal 462 is applied to the positive input terminal 483 of the low pass transconductance filter 470. The output terminal 498 of the low pass conductance filter 470 is connected to the negative terminal of amplifier 461.

Band Pass Filter

The transconductance filter devices are also directly applicable to the design of band pass filters. Band pass filtering characteristics can be generated by electronically coupling a low pass transconductance filter of this invention to a high pass transconductance filter of this invention. To produce the band pass filtering characteristics, the low pass transconductance filter is designed to generate a higher stop band while the high pass transconductance filter is designed to generate a lower stop band. The pass band comprises all frequencies between these two stop bands. In addition, a similar design approach can be used to produce band reject filtering characteristics.

FIG. 5(a)(1) shows a passive band pass filter comprising low pass filter 500 of FIG. 3a(1) and high pass filter 510 of FIG. 4a(1). The state variable networks for the low pass filter component and the high pass filter component of the band pass filter are shown in FIGS. 3a(2) and 4a(2), respectively. The transconductance filter implementations of these state variable networks are shown FIGS. 3a(3) and 4a(3), respectively. The components of the low pass filter are selected so that the filter generates the desired higher stop band, while the components of the high pass filter are selected so that the filter generates the desired lower stop band.

FIG. 5(a)(2) shows low pass transconductance filter implementation 515, high pass transconductance filter implementation 550, and their electronic coupling that enables them to coact to produce band pass filtering characteristics. Low pass transconductance filter implementation 515 comprises the same elements as that of FIG. 3a(3) and such elements bear the same numbers, increased by 400. High pass transconductance filter implementation 550 comprises the same elements as that of FIG. 4a(3) and such elements bear the same numbers, increased by 100. The output signal $V_1$ from the low pass filter stage 515 is the input signal path to the high pass filter stage 550. An input signal $V_{in}$ is applied along signal path 521, and the desired filter signal output $V_2$ is taken from signal path 562.

Figure 6:
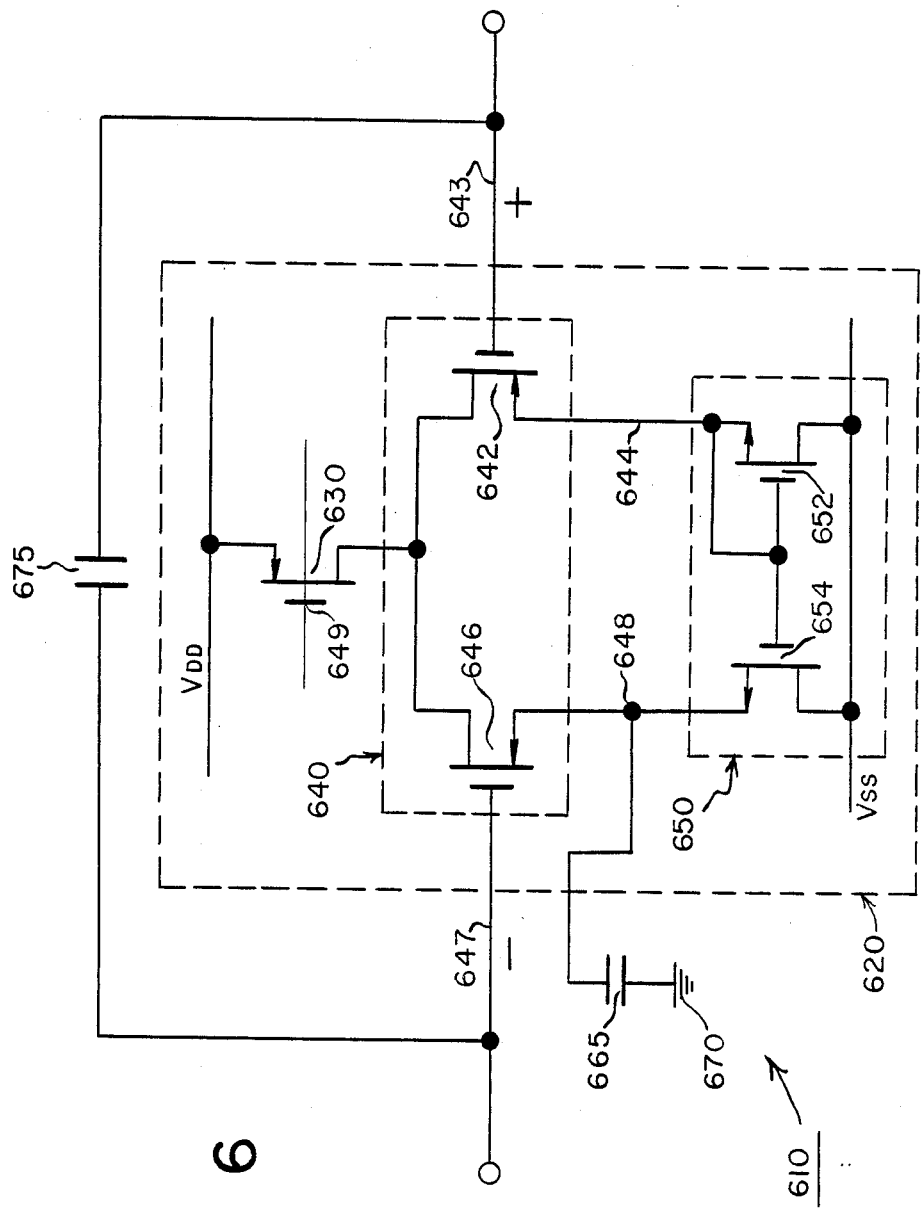
FIG. 6 is a circuit diagram showing a basic arrangement of a two-terminal, active-transconductance filter circuit to produce stop band zero roots according to the invention.

The Addition of Transmission Zeros (i.e., Stop Band Zeros) to the Filter Response FIG. 6 depicts a second preferred embodiment of the present invention in which a transconductance integrator 610 provides stop band zeros. Stop band zeros are those frequencies at which the network, such as a filter, does not pass any energy. By creating stop band zeros, it is possible to greatly reduce the transition region between a pass band and a stop band for a filter of any particular order.

The device of FIG. 6 comprises many of the same elements as that of FIG. 2 and such elements bear the same numbers, increased by 600. A stop band zero is produced at output terminal 648 of the device by capacitor 675, which is connected between the input terminals 643 and 647 of transistors 642 and 646 of the device. Capacitor 675 feeds some of the voltage at terminal 643 to terminal 647 and vice versa.

The technique described for designing low pass filters is an equally effective tool for designing ladder filters with stop band zeros. First, the passive filter with stop band zeros is modeled as a state variable network comprising integrators. This network is then readily converted to a transconductance ladder filter circuit by using transconductance filters, both with and without stop band zero capacitors, to model the state variable integrators.

As an example of the transconductance design technique to design a filter with a stop band zero, I will derive a transconductance filter implementation of the filter shown in FIG. 7a(1). The filter of FIG. 7a(1) is a capacitor-terminated LC ladder filter with stop band zero comprising inductor 701, capacitor 703, and stop band zero capacitor 705. Input voltage $V_{in}$ is applied at terminal 700 and output voltage $V_1$ is taken at terminal 702. Both signals are taken with reference to ground terminal 704. As shown in FIG. 7a(1), current $i_1$ flows through inductor 701, current $i_2$ flows through capacitor 705, and current $i_3$ flows through capacitor 703 such that the current flow at terminal 702 obeys the equation:

$$i_1 + i_2 + i_3 = 0 \tag{10}$$

FIG. 7a(2) shows the state variable network of the passive ladder filter. The network comprises voltage summer 720, current summer 724, as well as inductor integrator 721, capacitor integrator 722, and capacitor integrator 723 which model inductor 701, capacitor 705, and capacitor 703, respectively, of the passive filter.

The state variable network is derived by a straightforward extension of low pass filter design technique. As shown in FIG. 7a(2), voltage summer 720 generates the voltage difference $V_{in} - V_1$ which models this same voltage difference across inductor 701 and capacitor 705 of the passive filter. Current summer 724 models the Kirchhoff's current law in the same manner previously described in connection with the current summer shown in FIG. 3b(2).

In order to simplify this state variable network, the network is redrawn as shown in FIG. 7a(3) so that integrating capacitor 722 is modeled as differentiating capacitor 722'. As shown in FIG. 7a(2), capacitor 722 transforms current $i_2$ into the voltage difference $V_{in} - V_1$. In the state variable model shown in FIG. 7a(3), differentiating capacitor 722' effectively models these signal flows since it provides the same current $i_2$ between the same voltage difference $V_{in} - V_1$.

FIG. 7a(4) shows the transconductance filter implementation of the state variable network shown in FIG. 7a(3). The network comprises transconductance integrators 730 and 740 and stop band zero capacitor 750.

The input signal to the filter is applied at input terminal 733 of integrator 730. The filter output signal $V_1$, which is taken from terminal 748 of integrator 740, is the input signal to negative input terminal 737 of integrator 730. Stop band zero capacitor 750 is connected between these two input terminals of integrator 730. Output signal $i_1$ at terminal 738 of integrator 730 is an input signal to the positive input terminal 743 of integrator 740. The negative input terminal 747 of integrator 740 is grounded. The magnitudes of the integrator gain constants, $g_m/C$, of integrators 730 and 740 are set equal to the magnitudes of the inductance (in henries) of inductor 701 and the capacitance of capacitor 703, respectively, in the passive filter. Similarly, the capacitance of stop band zero capacitor 750 equals the capacitance of the capacitor 705 in the passive filter. These values, n turn, are obtained from the design equations for the filter.

The manner in which capacitor 675 creates a stop band zero is illustrated using the transconductance ladder filter shown in FIG. 8(b). This filter is an implementation of the passive filter shown in FIG. 8a. Using Kirchhoff's current law at nodes 723 and 727, the following equations can be derived to show that stop band capacitor 775 ($C_4$) is an element that feeds some of the voltage $V_3$ at terminal 723 to terminal 727 which contains voltage $V_4$ and vice versa.

$$V_3 = \frac{(V_1 - V_2)}{S(C_1 + C_4)} gm_1 + V_4 \frac{C_4}{C_1 + C_4} \tag{11}$$

$$V_4 = \frac{(V_2 - V_4)gm_3}{S(C_3 + C_4)} + V_3 \frac{C_4}{C_3 + C_4} \tag{12}$$

where:
$V_1$ = voltage at terminal 713 (i.e., $V_{in}$)
$V_2$ = voltage along signal path 790
$V_3$ = voltage at terminal 723
$V_4$ = voltage at terminal 727
$gm_1$ = transconductance of transconductance integrator 710
$gm_3$ = transconductance of transconductance integrator 730
$C_1$ = capacitance of capacitor 715
$C_2$ = capacitance of capacitor 725
$C_3$ = capacitance of capacitor 735

The transfer function $V_4/V_1$ may be derived from equations (11) and (12):

$$\frac{V_4}{V_1} = \frac{gm_1 gm_2 gm_3 + s^2 C_2 C_4 gm_1}{s^3 C_2(C_3[C_1 + C_4] + C_1 C_4) + sgm_2(C_3 gm_1 + C_1 gm_3) + gm_1 gm_2 gm_3} \tag{13}$$

where
$C_4$ = capacitance of stop band zero capacitor
$gm_2$ = transconductance of transconductance integrator 720 All other variables are defined as for equations 11 and 12.

From this equation, the zeros of the filter occur when the numerator equals zero which occurs when:

$$s = j \pm \sqrt{\frac{gm_2 gm_3}{(C_2)(C_4)}} \tag{14}$$

which is otherwise given as:

$$w_z = \sqrt{\frac{gm_2 gm_3}{(C_2)(C_4)}} \tag{15}$$

where $w_z$ = critical angular frequency where stop band zero occurs. Thus, stop band zero capacitor $C_4$ provides the filter with a stop band zero which occurs at the critical frequency given by equation 15.

Transconductance Ladder Filter With Improved Filtering Characteristics

The stability of a ladder filter comprising transconductance integrators can be greatly improved by controlling the current flow through each current source of each transconductance integrator of the ladder filter. In particular, controlled adjustments to the current source of each transconductance integrator of the ladder can compensate for variations in this current that arise from electrical tolerances in the MOS devices of each transconductance integrator.

Figure 9:
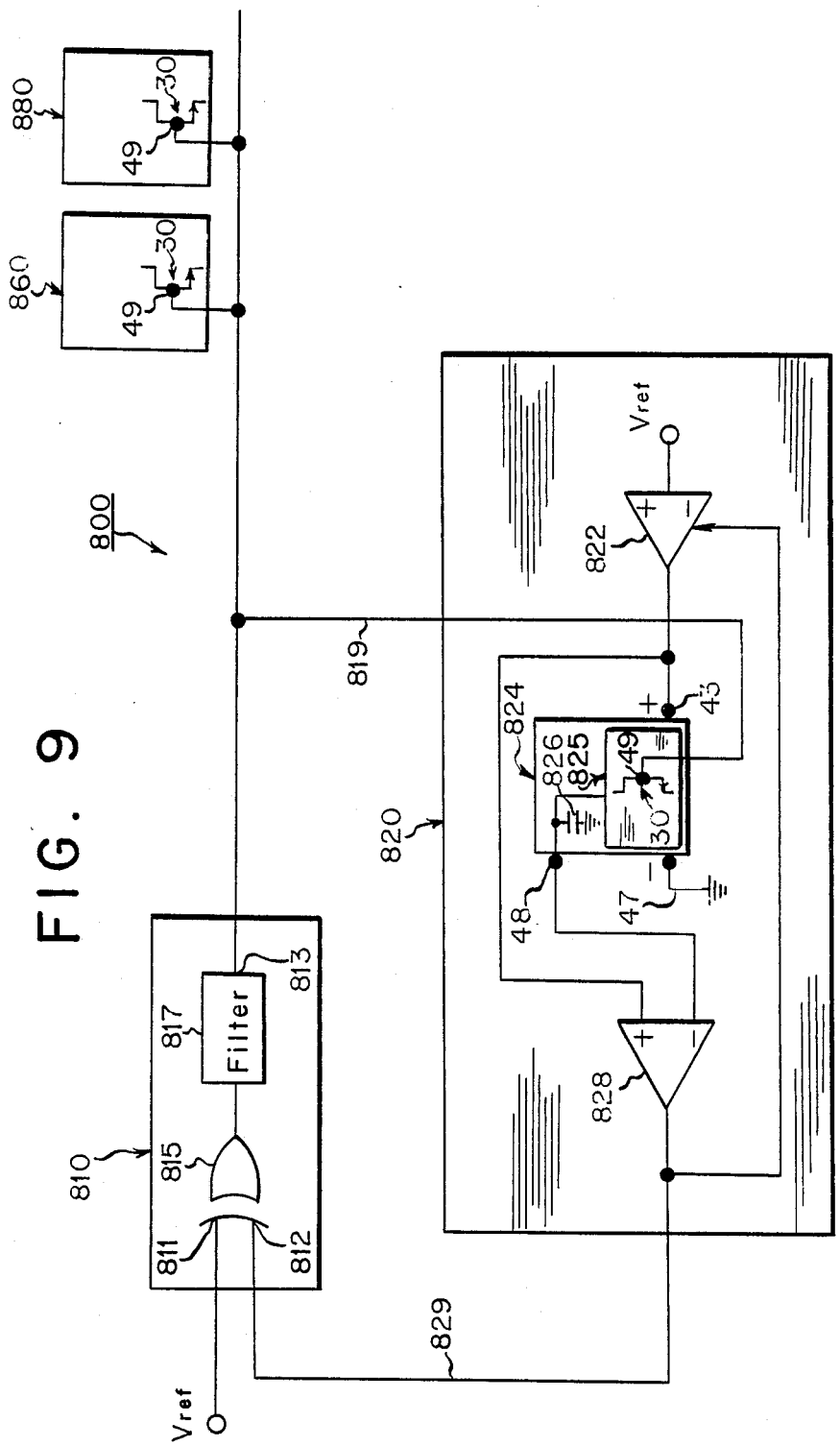
FIG. 9 is a circuit diagram of a transconductance filter implemented phase lock loop for providing precision current source control to each transconductance ladder filter.

FIG. 9 shows a phase lock loop circuit 800 in accordance with a preferred embodiment of this invention for providing such controlled adjustments. Circuit 800 comprises phase detector 810 and voltage-controlled oscillator 820 which are connected by signal path 819 to the current source circuits of each transconductance integrator (illustratively, integrators 860,880) of the ladder filter.

Phase detector 810 is a conventional phase detector circuit which compares the phase of an oscillator signal with a reference signal. If any difference exists between the phases of these two signals, the phase detector generates an error voltage which is a dc voltage proportional to this difference. As shown in FIG. 9, phase detector 810 has a reference signal applied at terminal 811 and an oscillator signal applied at 812. The output error voltage signal is taken at terminal 813. Illustratively, the phase detector comprises an exclusive OR gate 815, to which terminals 811 and 812 are connected, and a first-order filter 817, to which is applied the output of the exclusive OR gate and from which is taken the output error voltage.

The voltage-controlled oscillator (VCO) 820 is a free-running oscillator comprising switching amplifier 822, transconductance integrator 824, and comparator 828. Switching amplifier 822 has an input reference voltage $V_{ref}$ and a gain of plus or minus one depending on the output state of comparator 828. $V_{ref}$ is an arbitrary reference voltage which typically is about 0.7 volts. Transconductance integrator 824 comprises transconductance amplifier 825 and capacitor 826 and is identical to transconductance integrator 10 of FIG. 2. Comparator 828 compares the outputs of amplifier 822 and integrator 824 and switches output state every time the magnitude of the output of integrator 824 reaches $V_{ref}$, thereby causing switching amplifier 822 to change its output and reverse the direction of integration of integrator 824. The output of comparator 828 is also applied on signal path 829 to terminal 812 of the phase detector.

As a result of this arrangement, the output of integrator 824 is a triangle wave form having a frequency independent of $V_{ref}$ and the output of comparator 828 is a square wave of the same frequency. Since the input to the integrator is either $+V_{ref}$ or $-V_{ref}$ depending on the state of switching amplifier 822, the range of the output of integrator 824 is $2V_{ref}$. Accordingly, $2V_{ref}=kV_{ref}t$, where k is the integrator gain $g_m/C$ and t is the time it takes integrator 824 to integrate between signal level $-V_{ref}$ and $+V_{ref}$. Thus, it can be seen that the integration time in each direction is $t=2/k$ and the frequency of oscillation equals $k/4$. Since the output of comparator 828 changes state every time the magnitude of the output of integrator 824 reaches $V_{ref}$, the output of comparator 828 and therefore the output of VCO 820 is a square wave having a frequency of $k/4$.

The square wave signal from VCO 820 is fed back by way of signal path 829 to terminal 812 of phase detector 810, where it is compared with the reference frequency applied to terminal 811. As shown in FIG. 9, the output error signal is applied by way of signal path 819 to the gate terminals 49 of the current source circuits 30 of integrator 824 and the integrators (e.g., 860 and 880) of the ladder filter. Advantageously, all these integrators can be on the same chip.

When loop 800 is phase-locked, the frequency of the VCO output signal on signal path 829 equals $k/4$ where k is the integrator gain $g_m/C$. Since the input signal to phase detector 810 is a known frequency, the output dc signal on signal path 819 is a measure of the integrator gain of transconductance integrator 824. As a result, any change in the gain of transconductance integrator 824 because of variations in its electrical characteristics due, for example, to temperature or bias point variations will change the frequency of the VCO output signal and therefore the magnitude of the output dc signal on signal path 819.

The output signal on path 819 is applied as a control signal to the gate terminals of the current source circuits of transconductance integrators 860, 880 in such a way as to offset variations in the gain of such integrators due to these same variations in electrical characteristics. The transconductance amplifiers of the integrators 860, 880 of the ladder filter can be matched with the transconductance amplifier of integrator 824 and the size of the capacitors of integrators 860, 880 can be precisely selected relative to the capacitor of integrator 824. As a result, by choosing the proper size capacitor the gain of each integrator of the ladder filter can be selected to meet the design requirements for the filter while still providing compensation for variations in the electrical characteristics due, for example, to temperature and bias point variations.

Figure 10:
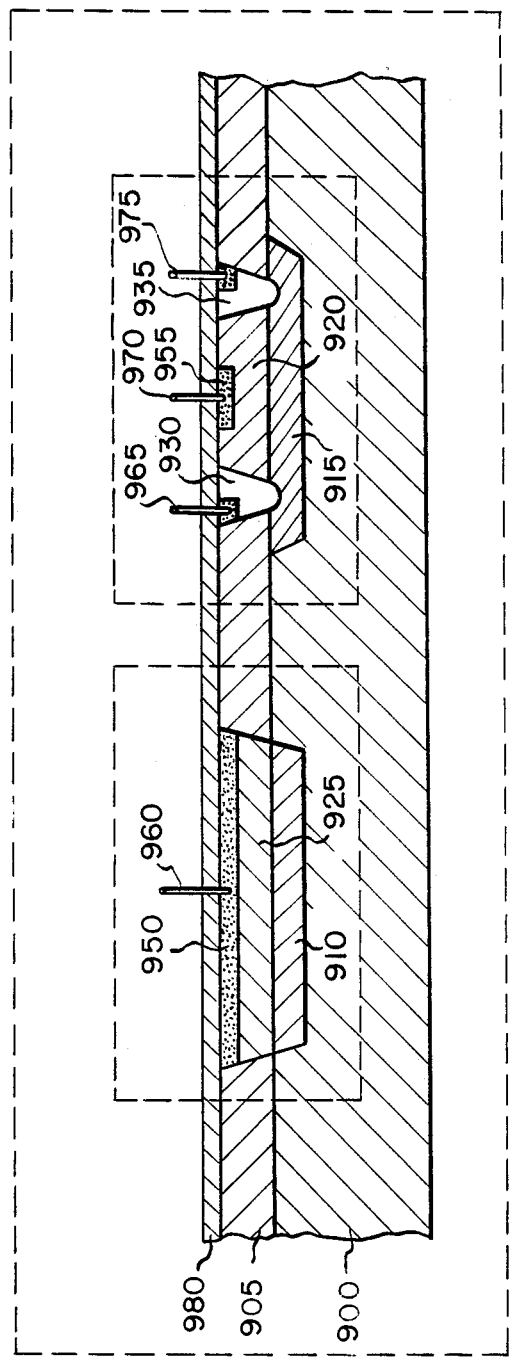
FIG. 10 is a cross-sectional view of a silicon substrate in an integrator implemented in accordance with the present invention.

FIG. 10 depicts a cross-sectional view of a portion of a monolithic integrated circuit in which is fabricated the transconductance amplifier and integrating capacitor of the present invention. FIG. 10 depicts only one of the transistors of the amplifier and the integrating capacitor but, as will be appreciated, many such amplifiers and capacitors can be fabricated on the same chip in the same manner. The construction of the other transistors is similar although some are of opposite conductivity type.

Illustratively, the starting material is a P-type substrate 900. In accordance with conventional fabrication procedures, the silicon substrate is exposed to a current of dry oxygen in an oven heated to a temperature between 1000° and 1300° C. to form a thick layer 905 of $SiO_2$ from 0.7 to 1.8 mm. thick. A capacitor bottom 910 and an MOS channel 915 are then formed. For example, a first photoresist, photomask, and diffusion step forms a buried layer of N-type material such as boron which constitutes capacitor bottom plate 910. An oxidation step then forms a layer of oxide on the substrate which becomes gate oxide 920 and capacitor dielectric region 925. N-type epitaxial layers 930 and 935 are then grown into substrate 905 to provide the n regions of a source and a drain of an N-channel transistor. Additional steps of photoresist, photomask, and deposition step form a conductive layer 950 on the oxide to provide the top plate of the capacitor, a conductive layer 955 that constitutes the gate electrode of the N-channel transistor, and conductive leads 960, 965, 970, and 975 to the capacitor, source, gate, and drain. Illustratively, a final oxidation step forms a thick layer of oxide 980 over the entire surface of the substrate to electrically isolate the capacitor and transistor from other circuit elements.

With respect to process variations, the microcircuit shown in FIG. 10 advantageously provides a filter which has both predictable and stable filter characteristics. Because both the gate oxide 920 of the MOS transistor and the dielectric 925 of the capacitor are fabricated at the same time using the same oxide material, any change in the transconductance $g_m$ of the transistor, such as a deviation in the thickness of the gate oxide layer due to some process variation, will also change the capacitance of the capacitor by an identical amount so that the integration constant $g_m/C$ remains constant.

As a result, variations in filter characteristics due to process variations other than fabrication of the oxide layer previously discussed are minimized.

While the invention has been described in conjunction with specific embodiments, it is evident in light of the foregoing description that numerous alternatives, modifications, and variations will be apparent to those skilled in the art. For example, different transconductance amplifier configurations could be used. MOS transistors could be replaced with junction-gate field effect transistors (JFET's), bipolar junction transistors (BJT's), or other amplifier devices. In addition, the various configurations of the preferred embodiments can be used to create any pass band and stop band filter characteristic. Finally, these configurations can be cascaded into a ladder filter to provide higher order filtering characteristics.

What is claimed is:

1. An nth order high pass filter, n being an integer number greater than one, comprising:
   a frequency independent amplifier having a positive differential input, a negative differential input, and an output;
   an nth order low pass filter, n being an integer number greater than one, comprising:
   n transconductance integrator devices connected in series, each said device comprising:
      a transconductance amplifier having at least a differential input and an output, said amplifier having an output current that is proportional to the difference in voltages applied to its differential input; and
      a capacitor connected between an output terminal of said amplifier output and ground, said capacitor coacting with the transconductance of said amplifier to provide an integrator gain $g_m/C$, where $g_m$ is the transconductance of said amplifier and C is the capacitance of said capacitor;
   means for connecting a positive differential input of each said device, except for the first device, to the output of the device immediately preceding it in the series;
   means for connecting a negative differential input of a last such device to ground; and
   means for connecting a negative differential input of each said device, except for the last such device, to the output of the device immediately following it in the series;
   means for connecting an output of said frequency independent amplifier to the input of the nth order low pass filter;
   means for connecting an output of said low pass filter to the negative differential input of said frequency independent amplifier; so that when said positive differential input terminal of said frequency independent amplifier has applied to it an input signal to be filtered said output of said frequency independent amplifier generates an electrical signal having a high band pass frequency spectrum and about an nth order attenuation at a lower end of said spectrum.

2. An n+mth order band pass filter, n and m being integer numbers greater than one, comprising:
   an nth order low pass filter comprising in series:
      n transconductance integrator devices connected in series, each said device comprising:
         a transconductance amplifier having at least a differential input and an output, said amplifier having an output current that is proportional to the difference in voltages applied to its differential input; and
         a capacitor connected between an output terminal of said amplifier output and ground, said capacitor coacting with the transconductance of said amplifier to provide an integrator gain, $g_m/C$, where $g_m$ is the transconductance of said amplifier and C is the capacitance of said capacitor;
      means for connecting a positive differential input of each said device, except the first device, to the output of the device immediately preceeding it in the series;
      means for connecting a negative differential input of a last such device to ground; and
      means for connecting a negative differential input of each said device, except for the last such device, to the output of the device immediately following it in the series;
   an mth order high pass filter having a lower cutoff frequency than said low pass filter comprising:
      a frequency independent amplifier having a positive differential input, a negative differential input, and an output
      an mth order low pass filter comprising in series:
         m transconductance integrator devices connected in series, each said device comprising:
            a transconductance amplifier having at least a differential input and an output, said amplifier having an output current that is proportional to the difference in voltages applied to its differential input; and
            a capacitor connected between an output terminal of said amplifier output and ground, said capacitor coacting with the transconductance of said amplifier to provide an integrator gain, $g_m/C$, where $g_m$ is the transconductance of said amplifier and C is the capacitance of said capacitor;
         means for connecting a positive differential input of each said device, except for the first device, to the output of the device immediately preceding it in the series;
         means for connecting a negative differential input of a last such device to ground; and
         means for connecting a negative differential input of each said device, except for the last device, to the output of the device immediately following it in the series;
      means for connecting an output of said frequency independent amplifier to the input of the nth order low pass filter;
      means for connecting an output of said low pass filter to the negative differential input of said frequency independent amplifier;
   means for connecting said output of said low pass filter to said input of said high pass filter; so that when said input of said low pass filter has applied to it an electrical signal to be filtered said output of said high pass filter generates an electrical signal having a mid-range pass band frequency spectrum and having about an mth order attenuation at a lower end of said spectrum and an nth order attenuation at an upper end of said spectrum.

3. An n+mth order band reject filter, n and m being integer numbers greater than one, comprising:
   an nth order low pass filter comprising in series:

n transconductance integrator devices connected in series, each said device comprising:
  a transconductance amplifier having at least a differential input and output, said amplifier having an output current that is proportional to the difference in voltages applied to its differential input; and
  a capacitor connected between an output terminal of said amplifier output and ground, said capacitor coacting with the transconductance of said amplifier to provide an integrator gain of said amplifier $g_m/C$, where $g_m$ is the transconductance of said amplifier and C is the capacitance of said capacitor;
means for connecting a positive differential input of each said device, except the first device, to the output of the device immediately preceding it in the series;
means for connecting a negative differential input of a last such device to ground; and
means for connecting a negative differential input of each said device, except for the last such device, to the output of the device immediately following it in the series;
an mth order high pass filter having a higher cutoff frequency than said low pass filter comprising:
  a frequency independent amplifier having a positive differential input, a negative differential input, and an output;
  an mth order low pass filter comprising in series:
    m transconductance integrator devices connected in series, each said device comprising:
      a transconductance amplifier having at least a differential input and an output, said amplifier having an output current that is proportional to the difference in voltages applied to its differential input; and
      a capacitor connected between an output terminal of said amplifier output and ground, said capacitor coacting with the transconductance of said amplifier to provide an integrator gain, $g_m/C$, where $g_m$ is the transconductance of said amplifier and C is the capacitance of said capacitor;
    means for connecting a positive differential input of each said device, except the first device, to the output of the device immediately preceding it in the series;
    means for connecting a negative differential input of a last such device to ground; and
    means for connecting a negative differential input of each said device, except for the last device, to the output of the device immediately following it in the series;
  means for connecting an output of said frequency independent amplifier to the input of the nth order low pass filter;
  means for connecting an output of said low pass filter to the negative differential input of said frequency independent amplifier;
  means for connecting said output of said low pass filter to said input of said high pass filter;
so that when said input of said low pass filter has applied to it an electrical signal to be filtered said output of said high pass filter generates an electrical signal with a frequency spectrum having a mid-range reject band and having about an nth order attenuation at a lower end of said band and an mth order attenuation at an upper end of said band.

4. An integrator device comprising:
  a transconductance amplifier having at least a differential input and an output, said amplifier having an output current that is proportional to the difference in voltages applied to its differential input; and
  a first capacitor connected between an output terminal of said amplifier output and ground said capacitor coacting with the transconductance of said amplifier to provide an integrator gain, $g_m/C$, where $g_m$ is the transconductance of said amplifier and C is the capacitance of said capacitor; and
  a second capacitor connected between terminals of said amplifier to which said differential input is applied.

5. An integrator device for use as a filter comprising:
  a transconductance amplifier having at least a differential input and an output, said amplifier having an output current that is proportional to the difference in voltage applied to its differential input; and
  a first capacitor connected between an output terminal of said amplifier output and ground; and
  a second capacitor connected between input terminals of said differential input, said second capacitor coacting with said first capacitor and the transconductance of said amplifier to provide a signal having a magnitude which is a function of the capacitances of said first and second capacitors and the transconductance of said amplifier and a critical transmission zero frequency which is defined by the capacitance of said second capacitor.

6. A filter with stop band zero comprising first and second transconductance integrator devices and a stop band zero capacitor:
  each said integrator device comprising:
    a transconductance amplifier having at least a positive differential input terminal, a negative differential input terminal, and an output terminal, said amplifier having an output current that is proportional to the difference in voltages applied to its differential inputs; and
    a capacitor connected between an output terminal of said amplifier output and ground, said capacitor coacting with the transconductance of said amplifier to provide an integrator gain, $g_mC$, where $g_m$ is the transconductance of said amplifier and C is the capacitance of said capacitor;
  said positive differential input terminal of said first transconductance integrator device receiving an input signal to said filter, said negative differential input terminal being connected to said output terminal of said second transconductance integrator device, said output terminal of said first transconductance integrator device being connected to said positive differential input terminal of said second transconductance integrator device, and said negative input terminal of said second transconductance integrator device being connected to a ground potential;
  said stop-band capacitor having a first end connected to said positive differential input terminal of said integrator device, and a second end connected to said negative differential input terminal of said first integrator device;
  whereby in response to an input signal to said positive differential input terminal of said first transconductance integrator device, said filter produces a second-order, low pass filtering characteristic at said output terminal of said second transconductance integrator device.

7. An n+mth order low pass filter with m stop band zeros, n and m being integer numbers greater than one, comprising:

n transconductance integrator devices, each said device comprising:
  a transconductance amplifier having at least a differential input and an output, said amplifier having an output current that is proportional to the difference in voltage applied to its differential input; and
  a capacitor connected between an output terminal of said amplifier output and ground, said capacitor coacting with the transconductance of said amplifier to provide an integrator gain, $g_m/C$, where $g_m$ is the transconductance of said amplifier and C is the capacitance of said capacitor; and m transconductance integrator devices with stop band zero, each said device comprising:
  a transconductance amplifier having at least a differential input and an output, said amplifier least a differential input and an output, said amplifier having an output current that is proportional to the difference in voltage applied to its differential input;
  a first capacitor connected between an output terminal of said amplifier output and ground;
  a second capacitor connected between input terminals of said differential input, said second capacitor coacting with said first capacitor and the transconductance of said amplifier to provide a signal having a magnitude which is a function of the capacitances of said first and second capacitors and the transconductance of said amplifier and a critical transmission zero frequency which is defined by the capacitance of said second capacitor;

said n and m integrator devices connected alternatively in series such that each said m type integrator device occupies the position in said series in relation to said n type device that its inductor-capacitor stop-band zero passive circuit equivalent occupies in relation to said n device's inductor or capacitor passive circuit equivalent when viewed at the input to which a signal to be filtered is applied;

means for connecting an output of each device in said series, except for the last device, to the positive differential input of the device immediately following it in the series;

means for connecting a negative differential input of said last device in said series to ground;

means for connecting a negative differential input of each device in said series, except for the last device, to the output of the device immediately following it in the series;

so that when said positive differential input of said first device in said series has applied to it a signal to be filtered; said output of said last device in said series generates an electrical signal having a frequency spectrum of low band, about an n+mth order attenuation at an upper end of said band, and m stop zeros.

8. An n+mth order high pass filter with m stop band zeros, n and m being integer numbers greater than one, comprising:

a frequency independent amplifier having a positive differential input, a negative differential input, and an output;

an n+mth order low pass filter with m stop band zeros, n and m being integer numbers greater than one, comprising:

n transconductance integrator devices, each said device comprising:
  a transconductance amplifier having at least a differential input and an output, said amplifier having an output current that is proportional to the difference in voltages applied to its differential input; and
  a capacitor connected between an output terminal of said amplifier output and ground, said capacitor coacting with the transconductance of said amplifier to provide an integrator gain, $g_m/C$, where $g_m$ is the transconductance of said amplifier and C is the capacitance of said capacitor; and m transconductance integrator devices with stop band zero, each said device comprising:
  a transconductance amplifier having at least a differential input and output, said amplifier having an output current that is proportional to the difference in voltage applied to its differential input;
  a first capacitor connected between an output terminal of said amplifier output and ground;
  a second capacitor connected between input terminals of said differential input, said second capacitor coacting with said first capacitor and the transconductance of said amplifier to provide a signal having a magnitude which is a function of the capacitances of said first and second capacitors and the transconductance of said amplifier and a critical transmission zero frequency which is defined by the capacitance of said second capacitor;

said n and m integrator devices connected alternatively in series such that each said m type integrator device occupies the position in said series in relation to said n type device that its inductor-capacitor stop-band zero passive circuit equivalent occupies in relation to said n device's inductor or capacitor passive circuit equivalent when viewed at the input to which a signal to be filtered is applied;

means for connecting an output of each device in said series, except for the last device, to the positive differential input of the device immediately following it in the series;

means for connecting a negative differential input of said last device in said series to ground;

means for connecting a negative differential input of each device in said series, except for the last device, to the output of the device immediately following it in the series;

means for connecting an output of said frequency independent amplifier to the input of the nth order low pass filter; and means for connecting an output of said low pass filter to the negative differential input of said frequency independent amplifier;

so that when said positive differential input of said frequency independent amplifier has applied to it an input signal to be filtered said output terminal of said independent amplifier generates an electrical signal having a high band pass frequency spectrum, about an n+mth order attenuation at a lower end of said spectrum, and m stop zeros.

9. An n+m+p+q order band pass filter with m+q stop band zeros, n and m and p and q being integer numbers greater than one, comprising:

an n+mth order low pass filter with m stop band zeros comprising:

n transconductance integrator devices, each said device comprising:
a transconductance amplifier having at least a differential input and output, said amplifier having an output current that is proportional to the difference in voltages applied to its differential input; and
a capacitor connected between an output terminal of said amplifier output and ground, said capacitor coacting with the transconductance of said amplifier to provide an integrator gain, $g_m/C$, where $g_m$ is the transconductance of said amplifier and C is the capacitance of said capacitor; and m transconductance integrator devices with stop band zero, each said device comprising:
a transconductance amplifier having at least a differential input and an output, said amplifier having an output current that is proportional to the difference in voltage applied to its differential input;
a first capacitor connected between an output terminal of said amplifier output and ground;
a second capacitor connected between input terminals of said differential input, said second capacitor coacting with said first capacitor and the transconductance of said amplifier to provide a signal having a magnitude which is a function of the capacitance of said first and second capacitors and the transconductance of said amplifier and a critical transmission zero frequency which is defined by the capacitance of said second capacitor;

said n and m integrator devices connected alternatively in series such that each said m type integrator device occupies the position in said series in relation to said n type device that its inductor-capacitor stop-band zero passive circuit equivalent occupies in relation to said n devices inductor or capacitor passive circuit equivalent when viewed at the input to which a signal to be filtered is applied;

means for connecting an output of each device in said series, except for the last device, to the positive differential input of the device immediately following it in the series;

means for connecting a negative differential input of said last device in said series to ground;

means for connecting a negative differential input of each device in said series, except for the last device, to the output of the device immediately following it in the series;

a p+qth order high pass filter having a lower cut off frequency than said low pass filter and having q stop band zeros, p and q being integer numbers greater than one, comprising:

a frequency independent amplifier having a positive differential input, a negative differential input, and an output;

a p+qth order low pass filter with q stop band zeros comprising:
p transconductance integrator devices, each said device comprising:
a transconductance amplifier having at least a differential input and an output, said amplifier having an output current that is proportional to the difference in voltages applied to its differential input; and
a capacitor connected between an output terminal of said amplififer output and ground, said capacitor coacting with the transconductance of said amplifier to provide an integrator gain, $g_m/C$, where $g_m$ is the transconductance of said amplifier and C is the capacitance of said capacitor; and q transconductance integrator devices with stop band zero, each said device comprising:
a transconductance amplifier having at least a differential input and an output, said amplifier having an output current that is proportional to the difference in voltage applied to its differential input;
a first capacitor connected between an output terminal of said amplifier output and ground;
a second capacitor connected between input terminals of said differential input, said second capacitor coacting with said first capacitor and the transconductance of said amplifier to provide a signal having a magnitude which is a function of the capacitances of said first and second capacitors and the transconductance of said amplifier and a critical transmission zero frequency which is defined by the capacitance of said second capacitor;

said p and q integrator devices connected alternatively in series such that each said q type integrator device occupies the position in said series in relation to said n type device that its inductor-capacitor stop-band zero passive circuit equivalent occupies in relation to said n device's inductor or capacitor passive circuit equivalent when viewed at the input to which a signal to be filtered is applied;

means for connecting an output of each device in said series, except for the last device, to the positive differential input of the device immediately following it in the series;

means for connecting a negative differential input of said last device in said series to ground;

means for connecting a negative differential input of each device in said series, except for the last device, to the output of the device immediately following it in the series;

means for connecting an output of said frequency independent amplifier to the input of the p+qth order low pass filter; and means for connecting an output of said low pass filter to the negative differential input of said frequency independent amplifier;

means for connecting said output of said low pass filter to said input of said high pass filter; so that when said input of said low pass filter has applied to it an electrical signal to be filtered said output of said high pass filter generates an electrical signal having a mid-range pass frequency spectrum and having about an p+qth order attenuation at a lower end of said spectrum, about an n+mth order attenuation at an upper end of said spectrum and m+q stop band zeros.

10. An n+m+p+q order band reject filter with m+q stop band zeros, n and m and p and q being integer numbers greater than one, comprising:

an n+mth order low pass filter with m stop band zeros comprising:

n transconductance integrator devices, each said device comprising:

a transconductance amplifier having at least a differential input and an output, said amplifier having an output current that is proportional to the difference in voltage applied to its differential input; and a capacitor connected between an output terminal of said amplifier output and ground, said capacitor coacting with the transconductance of said amplifier to provide an integrator gain, $g_m/C$, where $g_m$ is the transconductance of said amplifier and C is the capacitance of said capacitor; and m transconductance integrator devices with stop band zero, each said device comprising:

a tranconductance amplifier having at least a differential input and an output, said amplifier having n output current that is proportional to the difference in voltage applied to its differential input;

a first capacitor connected between an output terminal of said amplifier output and ground;

a second capacitor connected between input terminals of said differential input, said second capacitor coacting with said first capacitor and the transconductance of said amplifier to provide a signal having a magnitude which is a function of the capacitances of said first and second capacitors and the transconductance of said amplifier and a critical transmission zero frequency which is defined by the capacitance of said second capacitor;

said n and m integrator devices connected alternatingly in series such that each said m type integrator device occupies the position in said series in relation to said n type device that its inductor-capacitor stop-band zero passive circuit equivalent occupies in relation to said n device's inductor or capacitor passive circuit equivalent when viewed at the input to which a signal to be filtered is applied;

means for connecting an output of each device in said series, except for the last device, to the positive differential input of the device immediately following it in the series;

means for connecting a negative differential input of said last device in said series to ground;

means for connecting a negative differential input of each device in said series, except for the last device, to the output of the device immediately following it in the series;

a p+qth order high pass filter having a higher cut off frequency than said low pass filter and having q stop band zeros, p and q being integer numbers greater than one, comprising:

a frequency independent amplifier having a positive differential input, a negative differential input, and an output;

a p+qth order low pass filter with q stop band zeros comprising:

p transconductance integrator devices, each said device comprising:

a transconductance amplifier having at least a differential input and an output, said amplifier having an output current that is proportional to the difference in voltages applied to its differential input; and a capacitor connected between an output terminal of said amplifier output and ground, said capacitor coacting with the transconductance of said amplifier to provide an integrator gain, $g_m/C$, where $g_m$ is the transconductance of said amplifier and C is the capacitance of said capacitor; and q transconductance integrator devices with stop band zero, each said device comprising:

a transconductance amplifier having at least a differential input and an output, said amplifier having an output current that is proportional to the difference in voltage applied to its differential input;

a first capacitor connected between an output terminal of said amplifier output and ground;

a second capacitor connected between input terminals of said differential input, said second capacitor coacting with said first capacitor and the transconductance of said amplifier to provide a signal having a magnitude which is a function of the capacitances of said first and second capacitors and the transconductance of said amplifier and a critical transmission zero frequency which is defined by the capacitance of said second capacitor;

said p and q integrator devices connected alternatingly in series such that each said q type integrator device occupies the position in said series in relation to said n type device that its inductor-capacitor stop-band zero passive circuit equivalent occupies in relation to said n device's inductor or capacitor passive circuit equivalent when viewed at the input to which a signal to be filtered is applied;

means for connecting an output of each device in said series, except for the last device, to the positive differential input of the device immediately following it in the series;

means for connecting a negative differential input of said last device in said series to ground;

means for connecting a negative differential input of each device in said series, except for the last device, to the output of the device immediately following it in the series;

means for connecting an output of said frequency independent amplifier to the input of the p+qth order low pass filter; and means for connecting an output of said low pass filter to the negative differential input of said frequency independent amplifier;

means for connecting said output of said low pass filter to said input of said high pass filter; so that when said input of said low pass filter has applied to it an electrical signal to be filtered said output of said high pass filter generates an electrical signal having a mid-range band reject and having about an n+mth order attenuation at a lower end of said band, about a p+qth order attenuation at an upper end of said band and m+q stop band zeros.

11. An n+mth order band pass filter, n and m being integer numbers greater than one, comprising:
an nth order low pass filter comprising in series:
n transconductance integrator devices connected in series, each said device comprising:
a transconductance amplifier having at least a differential input and an output, said amplifier having an output current that is proportional to the difference in voltages applied to its differential input; and
a capacitor connected between an output terminal of said amplifier output and ground, said capacitor coacting with the transconductance of said amplifier to provide an integrator gain, $g_m/C$, where $g_m$ is the transconductance of said amplifier and C is the capacitance of said capacitor;
means for connecting a positive differential input of each said device, except the first device, to the output of the device immediately preceding it in the series;
means for connecting a negative differential input of a last such device to ground; and
means for connecting a negative differential input of each said device, except for the last such device, to the output of the device immediately following it in the series;
an mth order high pass filter having a lower cutoff frequency than said low pass filter comprising:
a frequency independent amplifier having a positive differential input, a negative differential input, and an output
an mth order low pass filter comprising in series,
m transconductance integrator devices connected in series, each said device comprising:
a transconductance amplifier having at least a differential input and an output, said amplifier having an output current that is proportional to the difference in voltages applied to its differential input; and
a capacitor connected between an output terminal of said amplifier output and ground, said capacitor coacting with the transconductance of said amplifier to provide an integrator gain, $g_m/C$, where $g_m$ is the transconductance of said amplifier and C is the capacitance of said capacitor;
means for connecting a positive differential input of each said device, except for the first device, to the output of the device immediately preceding it in the series;
means for connecting a negative differential input of a last such device to ground; and
means for connecting a negative differential input of each said device, except for the last device, to the output of the device immediately following it in the series;
means for electronically coupling said low pass filler to said high pass filler connecting an output of said frequency independent amplifier to the input of the nth order low pass filter;
means for connecting an output of said low pass filter to the negative differential input of said frequency independent amplifier;
means for electronically coupling said low pass filter to said high pass filter; so that when an electrical signal to be filtered is applied to said band pass filter, said band pass filter generates an electrical signal having a mid-range pass band frequency spectrum and having about an mth order attenuation at a lower end of said spectrum and an nth order attenuation at an upper end of said spectrum.

12. An n+mth order band reject filter, n and m being integer numbers greater than one, comprising:
an nth order low pass filter comprising in series:
n transconductance integrator devices connected in series, each said device comprising:
a transconductance amplifier having at least a differential input and an output, said amplifier having an output current that is proportional to the difference in voltages applied to its differential input; and
a capacitor connected between an output terminal of said amplifier output and ground, said capacitor coacting with the transconductance of said amplifier to provide an integrator gain, $g_m/C$, where $g_m$ is the transconductance of said amplifier and C is the capacitance of said capacitor;
means for connecting a positive differential input of each said device, except the first device, to the output of the device immediately preceding it in the series;
means for connecting a negative differential input of a last such device to ground; and
means for connecting a negative differential input of each said device, except for the last such device, to the output of the device immediately following it in the series;
an mth order high pass filter having a higher cutoff frequency than said low pass filter comprising:
a frequency independent amplifier having a positive differential input, a negative differential input, and an output;
an mth order low pass filter comprising in series:
m transconductance integrator devices connected in series, each said device comprising:
a transconductance amplifier having at least a differential input and an output, said amplifier having an output current that is proportional to the difference in voltages applied to its differential input; and
a capacitor connected between an output terminal of said amplifier output and ground, said capacitor coacting with the transconductance of said amplifier to provide an integrator gain, $g_m/C$, where $g_m$ is the transconductance of said amplifier and C is the capacitance of said capacitor;
means for connecting a positive differential input of each said device, except for the first device, to the output of the device immediately preceding it in the series;
means for connecting a negative differential input of a last such device to ground; and
means for connecting a negative differential input of each said device, except for the last device, to the output of the device immediately following it in the series;

means for connecting an output of said frequency independent amplifier to the input of the nth order low pass filter;
means for connecting an output of said low pass filter to the negative differential input of said frequency independent amplifier;
means for electronically coupling said low pass; so that when an electrical signal to be filtered is applied to said band reject filter, said band reject filter generates an electrical signal with a frequency spectrum having a mid-range reject band and having about an nth order attenuation at lower end of said band and an mth order attenuation at an upper end of said band.

* * * * *